US006640196B1

(12) United States Patent
Unsworth et al.

(10) Patent No.: US 6,640,196 B1
(45) Date of Patent: Oct. 28, 2003

(54) SYSTEM AND METHOD FOR MOTOR FAULT DETECTION BY SPACE VECTOR ANGULAR FLUCTUATION

(75) Inventors: Peter J. Unsworth, East Sussex (GB); Dragica Kostic Perovic, Kanjiza (YU)

(73) Assignee: Reliance Electric Technologies, LLC, Mayfield Heights, OH (US)

( * ) Notice: Subject to any disclaimer, the term of this patent is extended or adjusted under 35 U.S.C. 154(b) by 69 days.

(21) Appl. No.: 09/931,522

(22) Filed: Aug. 16, 2001

(51) Int. Cl.[7] .......... G06F 19/00
(52) U.S. Cl. .......... 702/115
(58) Field of Search .......... 324/500, 511, 324/522; 702/38, 57, 58, 64, 115, 184

(56) References Cited

U.S. PATENT DOCUMENTS

| | | | | |
|---|---|---|---|---|
| 5,270,640 A | | 12/1993 | Kohler et al. | |
| 5,635,811 A | * | 6/1997 | Rebhan et al. | 318/778 |
| 5,640,103 A | | 6/1997 | Petsche et al. | |
| 5,675,497 A | * | 10/1997 | Petsche et al. | 364/485 |
| 6,006,170 A | * | 12/1999 | Marcantonio et al. | 702/182 |
| 6,014,598 A | * | 1/2000 | Duyar et al. | 701/29 |
| 6,144,924 A | * | 11/2000 | Dowling et al. | 702/60 |
| 6,393,373 B1 | * | 5/2002 | Duyar et al. | 702/115 |

OTHER PUBLICATIONS

Arkan, M; Kostic–Perovic, D; Unsworth, P;"Induction Motor Fault Detection By Space Vector Angular Fluctuation";IEEE Industry Applications Conference 2000; vol. 1; May 2000; pp 388–394.*

Arkan, M; Kostic–Perovic, D; Unsworth, P;"Online Stator Fault Diagnosis In Induction Motors";IEE Proceedings–Electric Power Applications; vol. 148, Issue 6; Nov. 2001; pp 537–547.*

Discenzo, F M; Loparo, K A; Marcy, H O; Unsworth, P J;"Intelligent Motor Provides Enhanced Diagnostics And Control For Next Generation Manufacturing Systems"; Computer & Control Engineering Journal: vol. 11, Issue 5; Oct. 2000; pp 228–233.*

A.M.S. Mendes, A.J. Marques Cardoso, "Fault Diagnosis in a Rectifier–Inverter System used in variable speed AC drives, by Park's Vector Approach," IEEE SDEMPED, Spain, 1999, pp 99–103.

The Applications Engineering Staff of Analog Devices DSP Division, Digital Signal Processing Applications Using the ADSP–2100 Family, A Mar, Ed New Jersey; Prentice–Hall, 1990, pp54.

European Search Report related to 02017655.8 mailed Jan. 22, 2003.

Dragica Kostic–Perovic, et al.; "Induction Motor Fault Detection by Space Vector Angular Fluctuation"; 2000 IEEE; vol. 1 of 5; Oct. 8, 2000; pp. 388–394; XP–001043125.

A. Bellini, et al.; "Quantitative Evaluation of Induction Motor Broken Bars by Means of Electrical Signature Analysis"; 2000 IEEE; vol. 1 of 5; Oct. 8, 2000; pp. 484–491; XP–001043133.

* cited by examiner

*Primary Examiner*—John Barlow
*Assistant Examiner*—Douglas N Washburn
(74) *Attorney, Agent, or Firm*—Amin & Turocy, LLP; Alexander M. Gerasimow; William R. Walbrun

(57) ABSTRACT

Systems and methodologies are disclosed for detecting faults and adverse conditions associated with electric motors. The method comprises obtaining a current signal associated with the motor, calculating a space vector from the current signal, determining a space vector angular fluctuation from the space vector, and analyzing the space vector angular fluctuation in order to detect at least one fault associated with the motor. Systems are disclosed having a diagnostics component adapted to obtain a space vector angular fluctuation from a current signal relating to operation of the motor, and to analyze the space vector angular fluctuation in order to detect at least one fault in the motor.

34 Claims, 24 Drawing Sheets

SYSTEM AND METHOD FOR MOTOR FAULT DETECTION BY SPACE VECTOR ANGULAR FLUCTUATION

TECHNICAL FIELD

The present invention relates to the art of electric motors and more particularly to systems and methods for detecting motor faults by space vector angular fluctuation.

BACKGROUND OF THE INVENTION

Many industrial processes and machines are controlled and/or powered by electric motors. Such processes and machines include pumps providing fluid transport for chemical and other processes, fans, conveyor systems, compressors, gear boxes, motion control devices, screw pumps, and mixers, as well as hydraulic and pneumatic machines driven by motors. Such motors are combined with other system components, such as valves, pumps, conveyor rollers, fans, compressors, gearboxes, and the like, as well as with appropriate motor drives, to form industrial machines and actuators. For example, an electric motor may be combined with a motor drive providing electrical power to the motor, as well as with a pump, whereby the motor rotates the pump shaft to create a controllable pumping system.

Motors, pumps and bearings require frequent maintenance and observation in typical commercial systems and industrial plants. Motor faults developed in critical equipment are commonly detected by human experts through physical examination and other off-line tests. Such motor fault detection may be performed during regularly scheduled maintenance, at which time corrective action may be taken according to detected motor faults or problems. However, faults that go undetected during or between such routine maintenance may lead to catastrophic failure and/or unscheduled downtime in a plant. The probability of such downtime increases as the time period between successive maintenance inspections increases.

The frequency of performing maintenance, however, is limited by availability of manpower and financial resources, and hence is not easily increased. Some types of motor inspections, moreover, require stopping the process or even disassembling machinery. In such cases, the lost production-time may cost significantly more than the inspection labor cost. There is also a possibility that the reassembled machine may fail due to an assembly error or high start up stresses, for example. Finally, periodically replacing motors and components thereof (via routine preventive maintenance) is costly since the service life of good components may unnecessarily be cut short. Thus, there is a need for systems and methods of providing motor diagnostics by which motor faults in motorized systems and machines may be timely detected, and which reduce or eliminate system downtime and the costs associated with human inspection and diagnosis.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter. The invention provides systems and methodologies for detecting motor faults by space vector angular fluctuation, which require no human intervention or downtime, in order to identify motor faults such as stator faults, rotor faults, and even imbalances in power applied to the motor in a timely fashion. Systems and methodologies are provided for detecting faults and adverse conditions associated with electric motors. The methodology provides for analyzing the angular fluctuation in a current space vector in order to detect one or more faults associated with the motor. Systems are disclosed having a diagnostics component adapted to obtain a space vector from a current signal relating to operation of the motor, and to analyze the space vector angular fluctuation in order to detect motor faults.

According to one aspect of the invention, a method is provided for detecting motor faults, comprising calculating a space vector from a current signal related to operation of the motor and determining a space vector angular fluctuation. The space vector angular fluctuation may then be analyzed in order to detect at least one fault associated with the motor. The analysis of the space vector angular fluctuation may involve computing a frequency spectrum of the space vector angular fluctuation and analyzing the amplitude of one or more spectral components at certain frequencies. For example, fluctuations in amplitude of such spectral components may be analyzed or monitored in order to detect motor faults such as stator faults, rotor faults, shaft misalignment faults, and/or an imbalance in the power applied to the motor. Certain frequencies of interest may be thus analyzed, such as frequencies approximately twice the frequency of power applied to the motor. In this regard, a Goertzel algorithm may be advantageously employed to extract information related to certain frequencies of interest, in accordance with the invention.

Another aspect of the invention relates to systems and apparatus for detecting motor faults. Such systems may comprise a diagnostic component which obtains a space vector angular fluctuation from motor current signals, and which analyzes the space vector angular fluctuation in order to detect one or more faults in the motor. For instance, the diagnostic component may obtain a current signal associated with the motor, calculate a space vector from the current signal, and determine a space vector angular fluctuation from the space vector. The diagnostic component then analyzes the space vector angular fluctuation in order to detect at least one fault associated with the motor.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
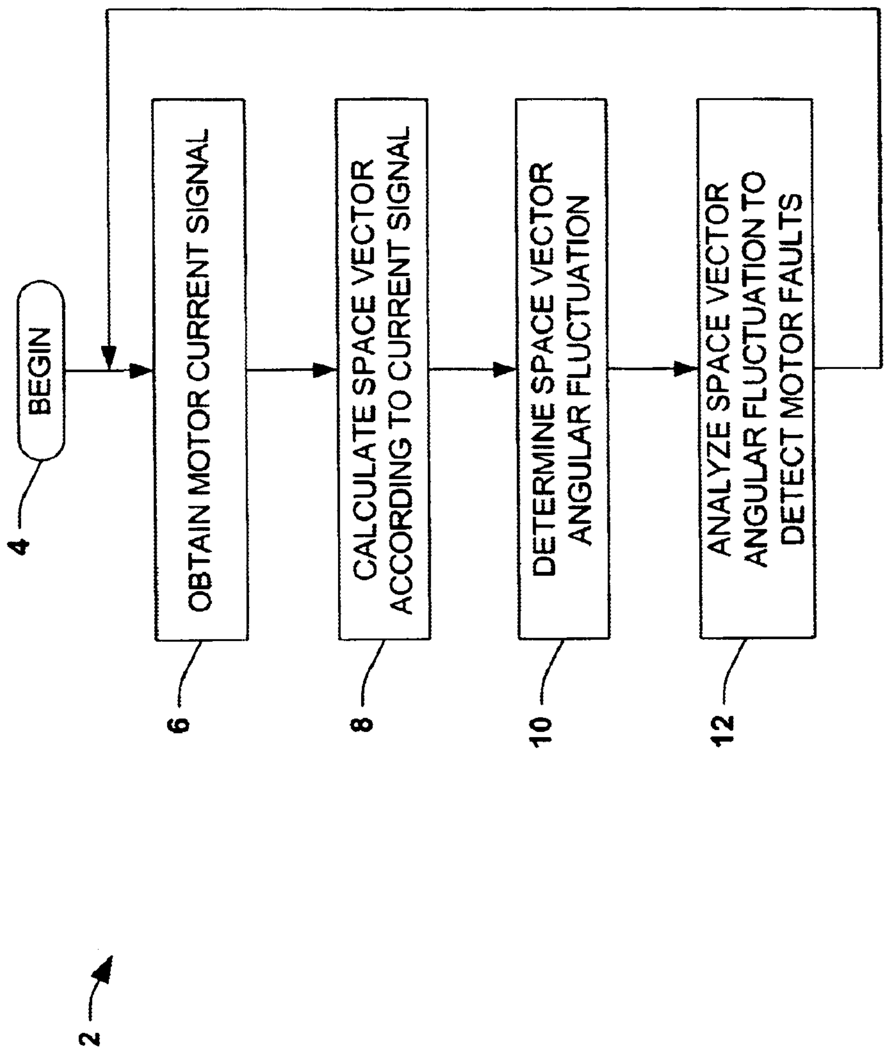
FIG. 1 is a flow diagram illustrating an exemplary method of detecting motor faults according to an aspect of the present invention.

The various aspects of the present invention will now be described with reference to the drawings, wherein like reference numerals are used to refer to like elements throughout. The invention provides methods and system for detecting motor faults by obtaining and analyzing space vector angular fluctuation. The invention is hereinafter illustrated with respect to one or more motorized pump systems and controls therefor. However, it will be appreciated that the invention finds application in association with many motorized systems and machines, including but not limited to fans, conveyor systems, compressors, gear boxes, motion control devices, pumps of centrifugal, positive displacement, and screw types, mixers, as well as hydraulic and pneumatic machines driven by motors. In addition, the attached figures and corresponding description below illustrate the invention in association with detecting and/or diagnosing stator faults, rotor faults, and/or power supply imbalance conditions, although it will be recognized that other performance characteristics of a motorized system may be detected and/or diagnosed in accordance with the present invention.

Referring now to the drawings, FIG. 1 illustrates an exemplary method 2 of detecting motor faults according to an aspect of the present invention. It will be appreciated that although the exemplary method 2 is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated and described herein, in accordance with the invention. Moreover, not all illustrated blocks, events, or acts, may be required to implement a methodology in accordance with the present invention. In addition, it will be appreciated that the exemplary method 2, as well as other methods according to the invention, may be implemented in association with the motorized pumps and systems illustrated and described herein, as well as in association with other motorized systems and apparatus not illustrated or described, including but not limited to fans, conveyor systems, compressors, gear boxes, motion control devices, pumps of centrifugal, positive displacement, and screw types, and mixers, as well as hydraulic and pneumatic machines driven by motors.

Beginning at 4, the method 2 comprises obtaining a motor current signal at 6 and calculating or otherwise obtaining a space vector therefrom at 8. For example, three phase motor currents may be sampled at 6, from which a current vector may accordingly be obtained at 8. At 10, the angular fluctuation in the resulting space vector is determined, which is analyzed at 12 in order to detect or diagnose one or more motor faults. For example, the angular fluctuation in the space vector may be used to identify stator faults, rotor faults, and/or imbalance conditions in power applied to the motor.

Figure 2:
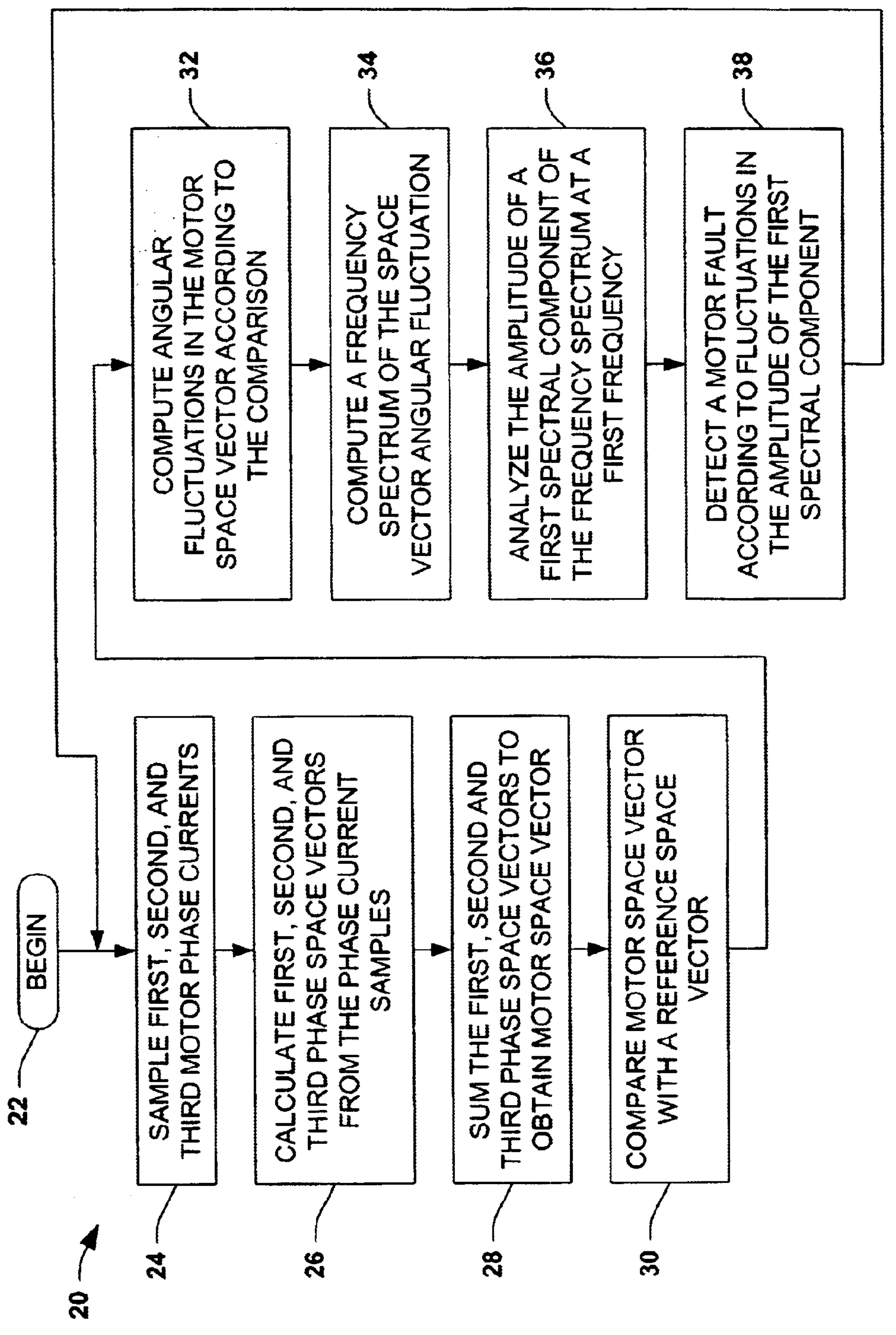
FIG. 2 is a flow diagram illustrating another exemplary method of detecting motor faults according the invention.

In FIG. 2, another exemplary method 20 is illustrated for detecting or diagnosing faults in an electric motor. While the exemplary method 20 is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated and described herein, in accordance with the invention. Moreover, not all illustrated blocks, events, or acts, may be required to implement a methodology in accordance with the present invention. In addition, it will be appreciated that the exemplary method 20 may be implemented in association with the motorized pumps and systems illustrated and described herein, as well as in association with other motorized systems.

Beginning at 22, first, second, and third motor phase currents are sampled at 24. These phase currents are then combined such as by vector summation at 28 in order to obtain or derive a motor space vector. At 30, the motor space vector obtained at 28 is compared with a reference space vector. For example, the reference space vector may be a balanced, symmetrical space vector rotating in a space vector plane with constant amplitude and at a constant speed according to the frequency of the power applied to the motor.

At 32, angular fluctuations in the motor space vector are computed according to the comparison of the motor space vector with the reference space vector at 30. It will be appreciated at this point that where no motor faults or problems exist, the motor space vector may not deviate from the reference space vector. In this case, no angular fluctuations in the space vector may be discerned. However, the inventors have found that angular fluctuations in the motor space vector are indicative of various adverse conditions associated with the motor, including motor faults in the stator and/or the rotor as well as unbalanced supply power. At 34, a frequency spectrum of the space vector angular fluctuation is computed, such as via Fourier analysis. Such a frequency domain spectrum may be obtained by any number of methods, including but not limited to fast Fourier transforms (FFT), discrete Fourier transforms (DFT) and the like, by which the sampled phase current data is represented in a frequency domain.

At 36, the amplitude of one or more spectral components is analyzed. For example, the amplitude of a spectral component at or around a certain frequency may be measured, where the frequency of interest is indicative of one or more motor faults or adverse conditions. One or more such spectral components of interest may be analyzed at 36, for example, at or around integer multiples of the frequency of power applied to the motor being diagnosed as well as sidebands around such spectral components. Techniques such as the Goertzel algorithm may be advantageously employed at 36 in order to analyze a particular spectral component for fault monitoring in real-time. In the case of a stator fault, which can develop rapidly, this allows diagnosis within one or a few cycles. It will be further appreciated that selective spectral component analysis techniques, such as the Goertzel algorithm, may allow for motor fault monitoring and diagnosis without computation of an entire spectrum at 34. In addition, the invention provides the ability to detect both stator and rotor faults as well as unbalanced supply power conditions, as illustrated and described in greater detail hereinafter.

At 38, one or more faults associated with the motor are detected or diagnosed according to fluctuations in the amplitude of the spectral component(s) analyzed at 36. The method 20 proceeds in this fashion through 24–38 in repetitive fashion. The rate of sampling motor current may be chosen to ascertain diagnostic information about the motor while preventing or reducing aliasing effects, and to achieve the required frequency resolution in the frequency spectrum derived from the space vector signal. Thus, for example, the first, second, and third current signals may be sampled at 24 at a frequency greater than twice the supply frequency of power applied to the motor not heretofore achievable with zero crossing time techniques. For another example, the first, second, and third current signals may be sampled at 24 at a frequency greater than six times the supply frequency of power applied to the motor not heretofore achievable with zero crossing time techniques. The invention thus provides for obtaining diagnostic information, which is derived from space vector angular fluctuation, wherein the space vector is derived from current data (e.g., stator current samples). The position of the current space vector in the space vector plane is studied through frequency domain analysis of space vector angular fluctuations, wherein variations of the phase angle of the current space vector may be subjected to Fourier transformation or other frequency spectral component isolation techniques for analysis in the frequency domain.

The methodologies according to the invention may thus comprise obtaining a current signal associated with the motor, calculating a space vector from the current signal, determining a space vector angular fluctuation from the space vector, and analyzing the space vector angular fluctuation in order to detect at least one fault associated with the motor. The current signal may be obtained, for instance, by sampling first, second, and third phase current signals associated with the motor. The space vector may then be calculated from the first, second, and third phase current signals, respectively, as illustrated and described in greater detail hereinafter. The angular fluctuation of the space vector may be determined by comparing the space vector with a reference space vector, wherein the reference space vector is a function of a constant frequency and amplitude, and computing angular fluctuations in the space vector according to the comparison, for example, by the use of a polynomial expansion of an arctangent function.

The analysis of the space vector angular fluctuation may comprise performing frequency spectrum analysis of the space vector angular fluctuation. For example, a frequency spectrum of the space vector angular fluctuation may be computed, and the amplitude of a first spectral component of the frequency spectrum at a first frequency may be analyzed in order to detect motor faults or other adverse conditions associated with the motor. In this regard, one or more motor faults may be detected by analyzing the amplitude of a spectral component and/or fluctuations in amplitude of the spectral component. For instance, spectral components may be analyzed at integer multiples of the frequency of power applied to the motor, such as twice the frequency of power applied to the motor, and/or sidebands around such frequencies. Techniques such as a Goertzel algorithm may be employed in accordance with the invention, in order to extract the amplitude of the spectral component(s) of interest. In this manner, faults such as stator faults, rotor faults, and imbalances in the power applied to the motor may be diagnosed in a timely fashion.

Figure 3:
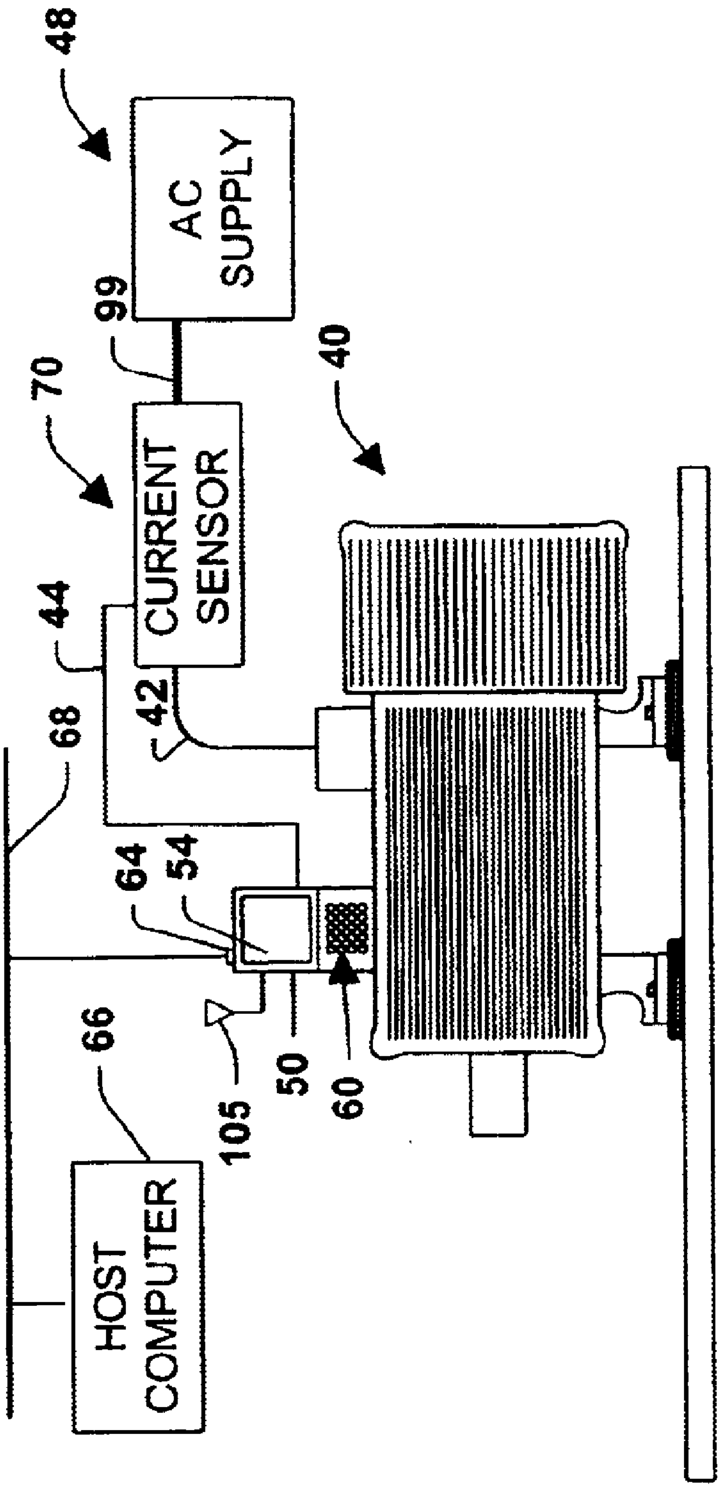
FIG. 3 is a side elevation view of an AC induction motor and diagnostic component in accordance with one particular aspect of the present invention.

Another aspect of the invention provides systems and apparatus for detecting or diagnosing motor faults. Referring now to FIG. 3, one specific motorized system or environment is illustrated, in which the present invention may be employed. An exemplary three phase AC induction motor 40 receives conductors from power lines via a conduit 42, which are tied to power supply lines 99 of the motor 40. The motor 40 is preferably AC powered and operates at an AC power line frequency of 60 Hz. However, it is to be appreciated that in various countries different power source or line frequencies (e.g., 50 Hz) may be employed. The motor 40 may be employed as part of a motorized system or machine, such as a motorized pump, fan, conveyor system, compressor, gearbox, motion control device, pump, or mixer, as well as a hydraulic or pneumatic machine driven by the motor 40.

A diagnostic component or device 50 is operatively associated with the motor 40. Coupled to the diagnostic component 50 via a sensor signal line 44 is a current sensor 70, which provides one or more sensor signals (not shown) representative of the motor current through the power lines 99. The diagnostic component 50 may include a display 54 for displaying information to an operator relating to the operation of the motor 40, and/or the motorized system of which the motor 40 is a part. The diagnostic component 50 may further include an operator input device 60 in the form of a keypad, which enables a user to enter data, information, function commands, etc. For example, the user may input information relating to motor status via the keypad 60 for subsequent transmission to a host computer 66. In addition, the keypad 60 may include up and down cursor keys for controlling a cursor, which may be rendered on the display 54. Alternatively or in addition, the diagnostic component 50 may include a tri-state LED (not shown) without the display 54 or the keypad 60. Furthermore, the diagnostic component 50 and the current sensor 70 could be integrated into the motor 40.

The diagnostic component 50 may further include a communications port 64 for interfacing the diagnostic component 50 with the host computer 66 via a conventional communications link. According to an aspect of the present invention, the diagnostic component 50 may be part of a communication system including a network backbone 68. The network backbone 68 may be a hardwired data communication path made of twisted pair cable, shielded coaxial cable or fiber optic cable, for example, or may be wireless or partially wireless in nature. Information is transmitted via the network backbone 68 between the diagnostic component 50 and the host computer 66 which are coupled to the network backbone 68. The communication link may support a communications standard, such as the RS232C standard for communicating command and parameter information. However, it will be appreciated that any communication link or network link such as DeviceNet suitable for carrying out the present invention may be employed.

Figure 4:
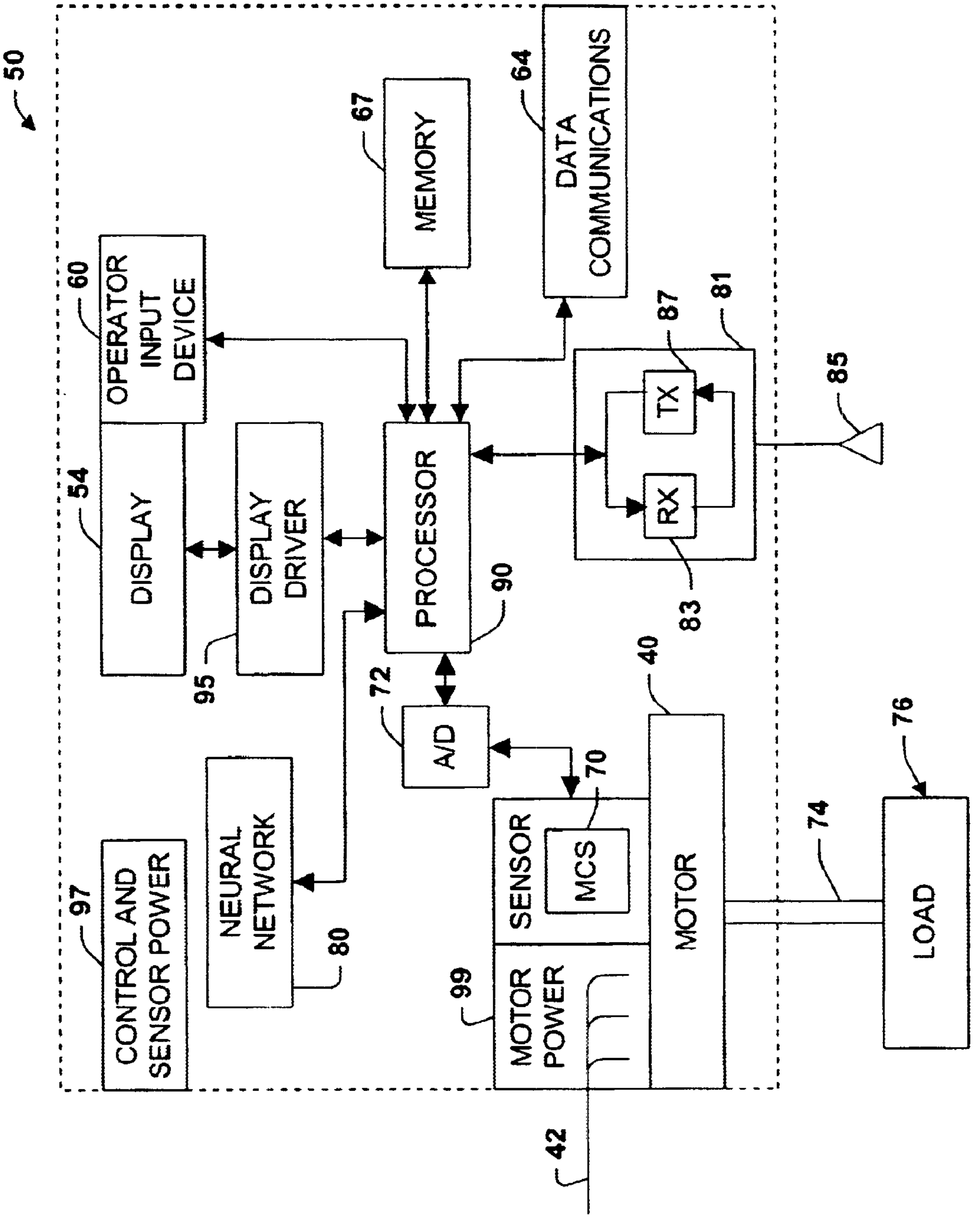
FIG. 4 is a functional schematic diagram of an AC induction motor and diagnostic component in accordance with the invention.

Referring now to FIG. 4, a schematic representation of the diagnostic component 50 is illustrated according to the present invention, wherein the diagnostic component 50 is integrated with the three phase induction motor 40. The induction motor 40 includes a load 76 at the front end thereof. An output shaft 74 connects the load 76 to the motor 40. It will be appreciated that while the diagnostic component 50 is illustrated in FIG. 4 as integral with motor 40, the diagnostic component 50 may be located remotely from the motor 40. Furthermore, it will be appreciated that the host computer 66 may itself be employed to carry out the herein described functions of the diagnostic component 50.

A processor 90 controls the general operation of-the diagnostic component 50. The processor 90 is programmed to control and operate the various components within the diagnostic component 50 in order to carry out the various functions described herein. The processor or CPU 90 can be any of a plurality of processors, such as are known, and other similar and compatible processors or micro controllers. The manner in which the processor 90 can be programmed to carry out the functions relating to the present invention will be readily apparent to those having ordinary skill in the art based on the description provided herein.

A memory 67 tied to the processor 90 is also included in the diagnostic component 50 and serves to store program code executed by the processor 90 for carrying out operating functions of the diagnostic component 50 as described herein. The memory 67 also serves as a storage medium for temporarily storing information such as historical fault data and the like. The memory 67 is adapted to store a complete set of the information to be displayed, and includes sufficient capacity to store multiple sets of information, and the processor 90 could include a program for alternating or cycling between various sets of display information. This feature enables the display 54 to show a variety of effects conducive for quickly conveying motor and/or system operating condition information to a user. The memory 67, moreover, may include read only memory (ROM) and random access memory (RAM). The ROM in this regard, may include among other code, the Basic Input-Output System (BIOS) which controls the basic hardware operations of the diagnostic component 50. The RAM is the main memory into which the application programs are loaded and sampled data is stored.

The display 54 is coupled to the processor 90 via a display driver system 95. The display 54 may be a liquid crystal display (LCD) or the like, which operates to display data or other information relating to ordinary operation of the motor 40 and/or the system of which motor 40 is a part. For example, the display 54 may render a set of discrete motor condition indicia such as, for example, fault indicia, caution indicia, and normal operation indicia which is displayed to the operator and maybe transmitted over a system backbone (not shown). Additionally, the display 54 may display a variety of functions that control the execution of the diagnostic component 50. The display 54 is capable of displaying both alphanumeric and graphical characters. Power is provided to the processor 90 and other components forming the diagnostic component 50 from a control and sensor power unit 97. However, it will be appreciated that such power could be obtained from the motor power leads 99 themselves via power converting circuitry or from network power (e.g., DeviceNet, not shown).

The diagnostic component 50 includes a communication subsystem 64, which includes a data communication port (not shown) to interface the processor 90 with the host computer 66 via the network 68. The diagnostic apparatus 50 also optionally comprises an RF section 81 connected to the processor 90. The RF section 81 includes an RF receiver 83, which receives RF transmissions from the host computer 66 for example via an antenna 85 and demodulates the signal to obtain digital information modulated therein. The RF section 81 also includes an RF transmitter 87 for transmitting information to the network backbone 68 or host computer 66, for example, in response to an operator input at input device 60 or the identification of a motor or system fault.

Figure 5:
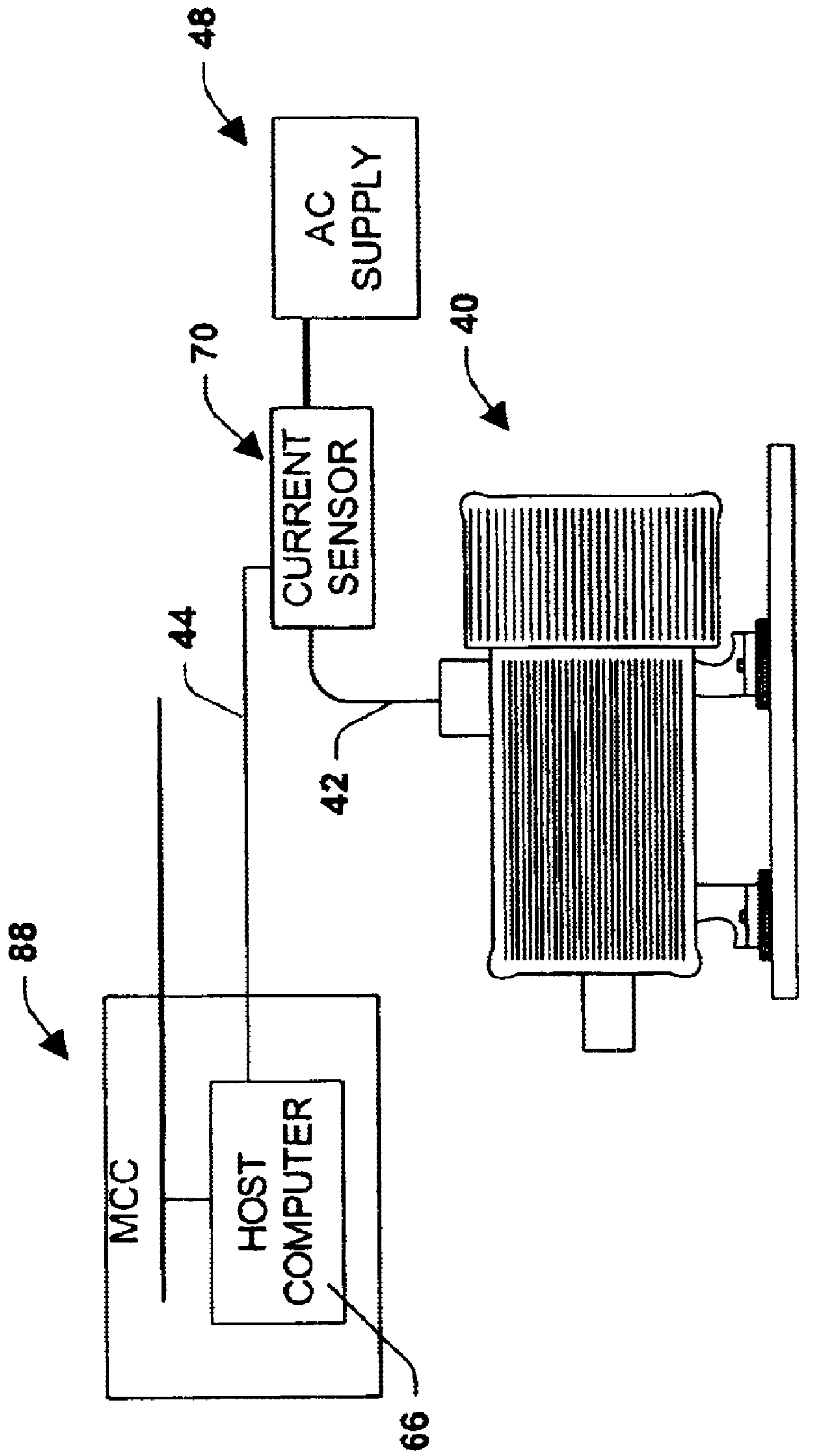
FIG. 5 is a side elevation view of an AC induction motor and host computer operating as a diagnostic apparatus with the host computer located in a motor control center in accordance with the invention.
Figure 6:
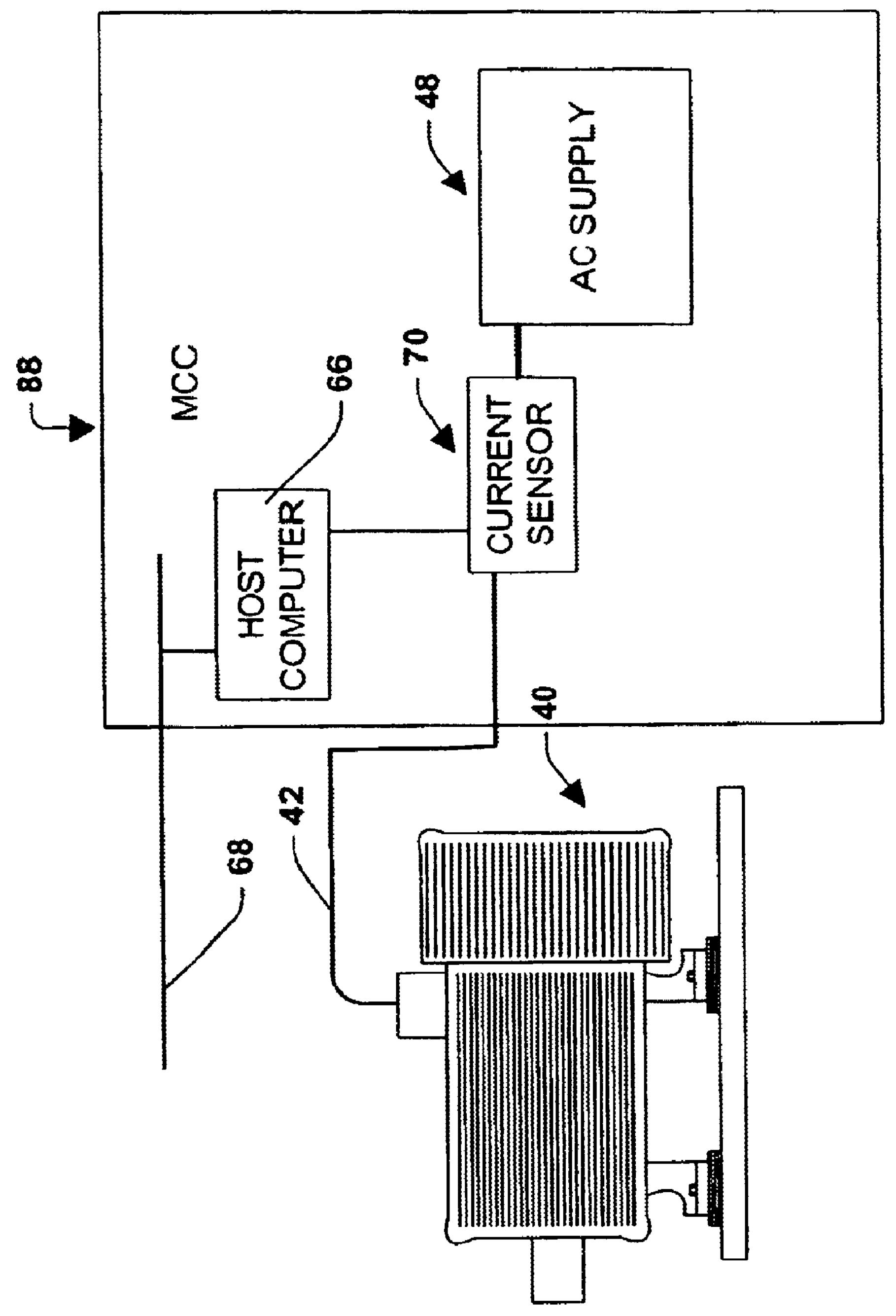
FIG. 6 is a side elevation view of an AC induction motor and host computer operating as a diagnostic apparatus with the host computer, power source and current sensor located in the motor control room in accordance with the invention.

In accordance with the invention, an AC power supply 48 (FIG. 3) drives the motor 40. At least one sensor 70 is operatively coupled to one or more of the AC power lines 99 (shown as motor power) connecting the motor 40 to the power source 48. The sensor 70 is tied to an analog to digital (A/D) converter 72, which converts the analog signals provided by the sensor 70 to digital form. The analog to digital converter 72 provides the processor 90 with digitally converted signals corresponding to the analog signals provided by the sensor 70. Typically the source of power is a motor controller or control center 88 (FIGS. 5 and 6). Such motor control centers are often used with industrial electric motors to start, control and protect the electric motor and associated electric circuitry. The motor control center may thus include motor starters to start and stop the motor along with circuit breakers to protect the electric motor and electric wiring.

The motor current sensor 70 may be arranged as a current transformer on one or more of the power lines 99 to generate signals corresponding to the current flowing through the respective power lead wires. Alternatively, it will be appreciated that motor current may be monitored by separate split core current transformers clipped on the phase lines at any point in the feed circuit for the motor 40. Such devices are similarly clamped about the lead wires to the motor 40 without requiring removal of insulation or breaking the wire. The motor current signal may be sensed substantially anywhere along the wire 99 running from the motor 40 back to the switch which directs the current from a common main to the wires carrying it to the motor 40.

One possible location is at the motor control center 88 since this is located typically in a more work friendly, controlled environment (e.g., less electrical noise, HVAC controlled environment, and easier physical access) than the environment in which the motor 40 located. As illustrated in FIG. 5, the current sensor 70 and the power supply 48 may be located on a factory floor, while current signal line 44 is routed back to the motor control room 88, where it is coupled to the host computer 66. Distance limitations, line-noise, and wiring costs may limit the usefulness of this configuration. Alternatively, the power supply 48, the current sensor 70 and the host computer 66 are located in the motor control room 88 as shown in FIG. 6. This may provide a cleaner and less noisy environment for performing diagnostics on the motor 40. Another possible configuration is to locate the sensor 70 and computer within the motor. Motor health may be indicated only locally (light pole, LED, or annunciator) or transmitted to a host computer or control computer (to protect equipment and process) either with wireline or wireless data links.

Figure 7:
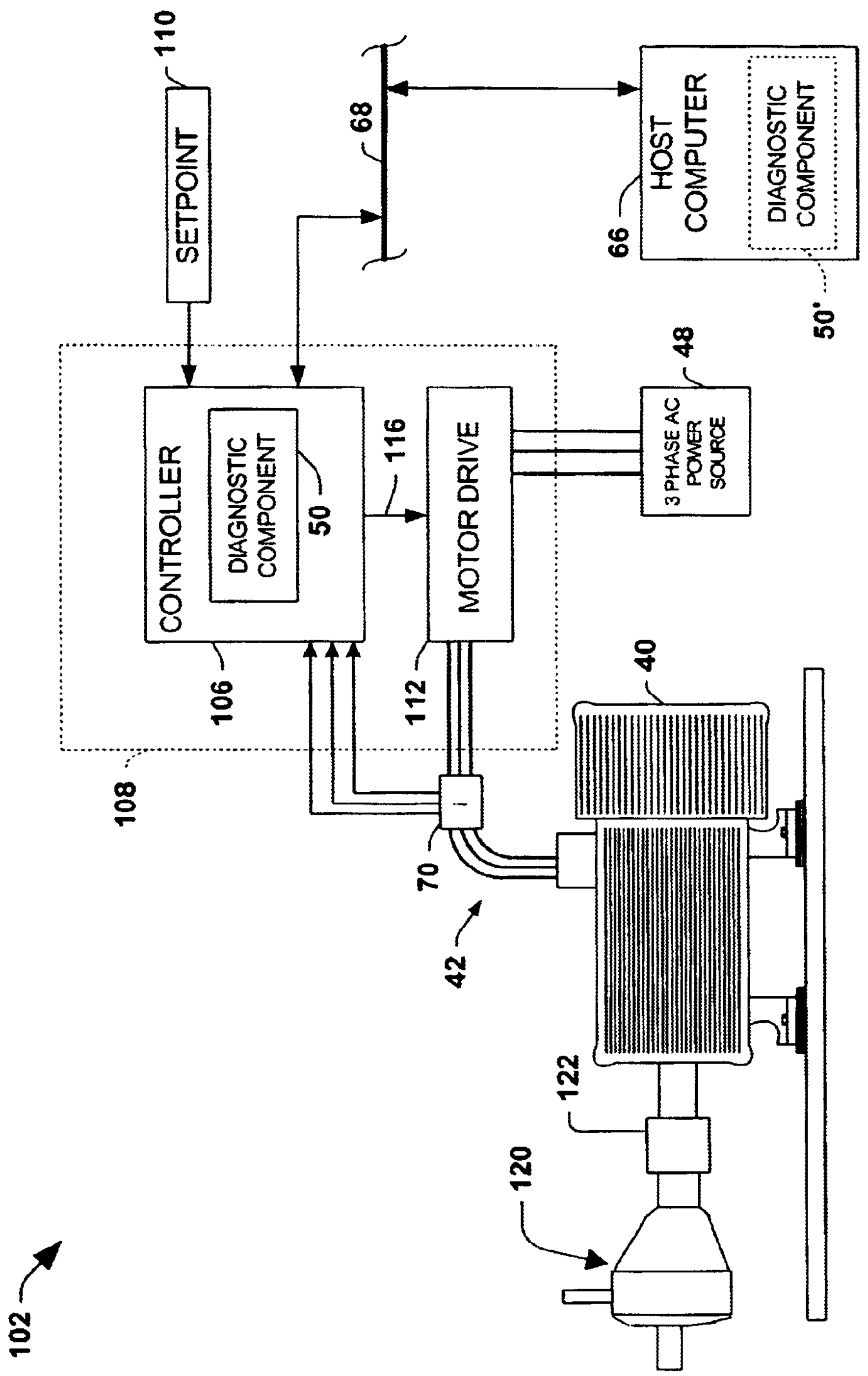
FIG. 7 is a side elevation view of an AC induction motor and control system operating as a diagnostic apparatus together with a host computer, power source and current sensor in accordance with the present invention.

Another possible configuration of the diagnostic component 50 and the motor 40 is illustrated in FIG. 7, wherein the diagnostic component 50 resides in a control system 108 having a controller 106 receiving a setpoint 110 (e.g., from a user via a user interface, not shown), and providing a control signal 116 to a motor drive 112. The motor 40 receives electrical current from the motor drive 112 via power leads 42, the value of which is provided to the controller 106 via current sensor 70. The controller 106 comprises the diagnostic component 50 for detecting one or more faults in the motor 40 according to the sensed current value(s) from the sensor 70, and further provides for operation of the motor 40 via the control signal 116 according to the setpoint 110. The motor 40 and control system 108 may be part of a motorized system or machine 102, wherein the motor 40 drives a pump 120 via a shaft coupling 122, in which case the setpoint 110 may be in units of desired flow rate or other units relating to the operation of the pump 120.

It will be appreciated that while the motor 40 is illustrated in FIG. 7 as part of a motorized pump system 102, that the various aspects of the present invention may also be employed in association with other forms of motorized machines or systems, including but not limited to pumps providing fluid transport for chemical and other processes, fans, conveyor systems, compressors, gear boxes, motion control devices, pumps, and mixers, as well as hydraulic and pneumatic machines driven by motors, for example, wherein the motor 40 may be combined with other system components, such as valves, pumps, conveyor rollers, fans, compressors, gearboxes, and the like, as well as with appropriate motor drives, to form industrial machines and actuators.

The control system 108 may be further adapted to interface with a network 68 as described hereinabove, whereby communication with a host computer 66 may be achieved. In this regard, the host computer 66 may alternatively or in combination comprise a diagnostic component 50' operating in similar fashion to the diagnostic component 50 illustrated and described herein. Thus, for example, the sensed current values from the sensor 70 may be communicated to the diagnostic component 50 in the controller 106, and/or to the diagnostic component 50' in the host computer 66, in order to detect faults or other adverse conditions related to the motor 40 and/or the system 102 of which the motor 40 is a part, in accordance with the various aspects of the invention. The controller 106, moreover, may also be adapted to modify the control signal 116 according to one or more such diagnosed-or detected fault conditions. In this regard, the host computer 66 may send information (not shown) to the controller 106 via the network 68 relating to fault conditions detected by the diagnostic component 50', based on which the controller 106 may make appropriate changes in the operation of the system 102 via modifications to the control signal 116.

The exemplary diagnostic component 50 (e.g., and/or diagnostic component 50') may be adapted to perform various fault detection tasks, which may be accomplished in hardware, software, and/or combinations thereof, in order to diagnose or detect one or more faults in the motor 40. In particular, the diagnostic component 50 may obtain a space vector angular fluctuation from a current signal (e.g., from sensor 70) relating to operation of the motor 40, and analyze the space vector angular fluctuation in order to detect at least one fault in the motor 40 or the system 102. For a typical three phase motor (e.g., motor 40), the diagnostic component 50 is adapted to sample first, second, and third phase current signals associated with the motor 40, and to calculate the motor space vector from the first, second, and third phase current signals.

The diagnostic component 50 may, for example, calculate a space vector from the first, second, and third phase currents, as described in greater detail hereinafter. The space vector may then be compared with a reference space vector, such as a reference space vector, which is a function of a constant frequency and amplitude. Angular fluctuations in the space vector may be calculated according to the comparison, for instance, by computing,a polynomial expansion of an arctangent function in order to compute angular fluctuations in the space vector. The diagnostic component 50 is further adapted to perform frequency spectrum analysis of the space vector angular fluctuation in order to detect motor faults and adverse conditions. For instance, the diagnostic component 50 may compute a frequency spectrum (e.g., or a portion thereof) of the space vector angular fluctuation, and analyze the amplitude of a spectral component, and/or fluctuations or variations in the component amplitude, at one or more frequencies of interest, such as integer multiples of the frequency of power applied to the motor. The diagnostic component 50, moreover, may advantageously employ techniques such as the Goertzel algorithm to extract the amplitude of the spectral component of interest in real time, so as to quickly detect or diagnose motor faults or problems prior to catastrophic failure of the motor 40.

In order to further illustrate the various aspects of the invention, the following description and accompanying drawings are provided, including exemplary experimental and simulated results showing the diagnostic capabilities according to the invention. The space vector angular fluctuation technique (SVAF), provides significant advantages over other analytical methodologies, such as the zero cross times method (ZCT) for induction motor failure prediction. The ZCT method employs zero crossing times of three phase motor current waveforms as data for spectral analysis of induction motor current. The inventors of the present invention have found that fluctuations in the angle of the space vector hold information on motor condition, and that when these are analyzed by means of FFT or other frequency spectral analysis techniques, diagnostic indices for stator and rotor faults can be defined. The main drawback in the ZCT method was limited sampling frequency, whereas the SVAF method overcomes this limitation, thus giving more reliable diagnostic data, since aliasing effects can be removed.

The ZCT method of induction motor fault detection measures times $t_i$ at which the three phase currents cross through zero. A series of data values is derived as the time difference between pairs of adjacent zero crossing times minus the expected 60 degree time interval $\Delta T$ between two zero crossings. For a three phase system with six zero crossings per mains cycle, this produces six samples per supply cycle with the data given by $$\delta t_i = t_i - t_{i-1} - \Delta T, \tag{1}$$

with $\Delta T = 1/300$ sec for a 50 Hz supply.

Since the phase lag angle of motor current behind the supply voltage varies with load, it follows that fluctuations in load or speed from any cause will be encoded as modulation of the ZCT data values $\delta t_i$. These data values represent the fluctuations in the zero crossing times, and in an ideal system at constant speed, would all be equal to zero. Hence, only the fluctuations in load are encoded. Because there are six zero current crossings in each supply cycle in a typical three phase system, the ZCT sampling is fixed at only six samples per cycle. Hence the sampling frequency of the ZCT signal is 300 Hz with a 50 Hz supply, giving a range of frequencies covering only (0–150) Hz in a ZCT spectrum.

The SVAF methodology according to the present invention is not so limited in sampling rate, and hence aliasing may be overcome or minimized, which heretofore has been problematic in association with the ZCT technique. Thus, the invention provides for deriving sampled data from the rotational motion of the space vector representing the three phase currents, instead of just from the zero crossings. The balanced stator currents of amplitude I, phase angle $\Phi$ and angular frequency $\omega_s$ for a symmetrical three phase winding are represented by the following equation (2):

$$\begin{bmatrix} i_a(t) \\ i_b(t) \\ i_c(t) \end{bmatrix} = I \begin{bmatrix} \cos(\omega_s t + \phi) \\ \cos(\omega_s t + \phi - 2\pi/3) \\ \cos(\omega_s t + \phi - 4\pi/3) \end{bmatrix}. \tag{2}$$

These stator currents define a space vector as the sum of individual phase current samples given by equation (3):

$$\vec{i}_s(t) = \frac{3}{2}\left[i_a(t) + a i_b(t) + a^2 i_c(t)\right], \tag{3}$$

where $a = e^{j2\pi/3}$ is a space operator.

For a balanced, symmetrical, steady state system, this vector rotates in the space vector plane with constant amplitude in the positive direction at synchronous speed. Its locus in the space vector plane is a perfect circle, as shown in (4):

$$\vec{i}_s(t) = I e^{j\Phi} \cdot e^{j\omega_s t}. \tag{4}$$

However, for a system, with presence of any other additional component caused by either stator fault, rotor fault or other unbalance, of amplitude $I_{comp.}$, angular frequency $\omega_{comp.}$ and phase angle $\phi_{comp}$, the three phase currents may be written as in (5).

$$\begin{bmatrix} i_a(t) \\ i_b(t) \\ i_c(t) \end{bmatrix} = I \begin{bmatrix} \cos[\omega_s t + \phi] \\ \cos[\omega_s t + \phi - 2\pi/3] \\ \cos[\omega_s t + \phi - 4\pi/3] \end{bmatrix} + I_{comp} \begin{bmatrix} \cos[\omega_{comp.} t + \phi_{comp.}] \\ \cos[\omega_{comp.} t + \phi_{comp.} - 2\pi/3] \\ \cos[\omega_{comp.} t + \phi_{comp.} - 4\pi/3] \end{bmatrix} \tag{5}$$

Substituting (5) into (3), the currents in (5) can be expressed in space vector form:

$$\vec{i}_s(t) = I e^{j\Phi} e^{j\omega_s t} + I_{comp.} e^{j\Phi_{comp.}} e^{j\omega_{comp.} t} \tag{6}$$

$$\vec{i}_s(t) = \vec{I} e^{j\omega_s t} + \vec{I}_{comp} e^{\omega_{comp} t} = i + \vec{i}_{comp.} \tag{7}$$

The resultant space vector is the sum of the space vectors for the fundamental and the additional component. The locus of the space vector will no longer be a perfect circle due to the combined effect of the present components. Apart from distortion in the space vector's amplitude, the; result is that the rotational speed of the space vector fluctuates so that it does not pass any specific point on the circle at equal intervals $2\pi/\omega_s$, but does so with fluctuating delays. The space vector angular fluctuation (SVAF) method explores these fluctuations by measuring them with respect to the balanced referent signal of amplitude I and angular frequency $\omega_s$. The resultant space vector from (6) divided by referent space vector is given in (8):

$$\frac{\vec{i}_s(t)}{\vec{i}_{sr}(t)} = 1 + \vec{I}' e^{-j\omega' t}, \tag{8}$$

with $$\vec{I}' = \frac{\vec{I}_{comp.}}{\vec{I}},$$

and $\omega' = \omega_s - \omega_{comp}$. Finally, the angular fluctuation of the space vector may be found using equation (9):

$$\delta\theta(t) = \arctan\left(\frac{\vec{i}_s(t)}{\vec{i}_{sr}(t)}\right) = \arctan\left(-\frac{I'\sin\omega' t}{1 + I'\cos\omega' t}\right). \tag{9}$$

The following polynomial expansion (10) computes the arctangent of a variable x, when (x<1):

$$\arctan(x) = 0.318253x + 0.003314x^2 - 0.130908x^3 + 0.0068542x^4 - 0.009159x^5$$

$$\arctan(x) = \alpha \cdot + \beta \cdot x^2 - \gamma \cdot x^3 + \delta x^4 \epsilon \cdot x^5 \tag{10}$$

Since I'<1, this expansion can be applied to (9). If only the first term of the expansion, $\alpha x$, is taken into consideration, together with binomial expansion for the argument of the arctangent function in (9), the following expression (11) is obtained:

$$\delta\theta(t) = -\alpha\left[I'\sin\omega' t - \frac{I'^2}{2}\sin 2\omega' t + \frac{I'^3}{2}\left[\sin\omega' t + \frac{1}{2}(\sin 3\omega' t - \sin\omega' t)\right] - \ldots\right] \quad (11)$$

Equation (11) indicates frequencies that can be expected in the spectrum of the SVAF signal. To obtain the fluctuations in a real system, the instantaneous rotational position $\theta_i$ of the current space vector, which advances with each sample instant, is calculated in the space vector plane using $$\theta_i = \arctan(\vec{i}_s((t_i))).$$

When the expected increment in rotational position $\theta=\omega_s t_i$ for uniform rotation at angular frequency $\omega_s$ is subtracted, fluctuations $\delta\theta_i$ in the angular position are obtained and given by (12):

$$\delta\theta_i = \theta_i - \omega_s t_i, \quad (12)$$

where $\theta_i$ is the sampled phase angle of the rotating space vector of the real system during faulty condition, $\omega_s$ is the supply angular frequency and $t_i$ is the sample time. A voltage signal can be taken as a referent signal, since it will hold accurate information about mains supply frequency currently present in the signal. Alternatively, equally spaced samples from the space vector circle can be taken and from two consecutive samples and the expected rotation increment $\Theta$ can be subtracted, as in equation (13):

$$\delta\theta_i = \theta_i - \theta_{i-1} - \Theta. \quad (13)$$

Figure 8:
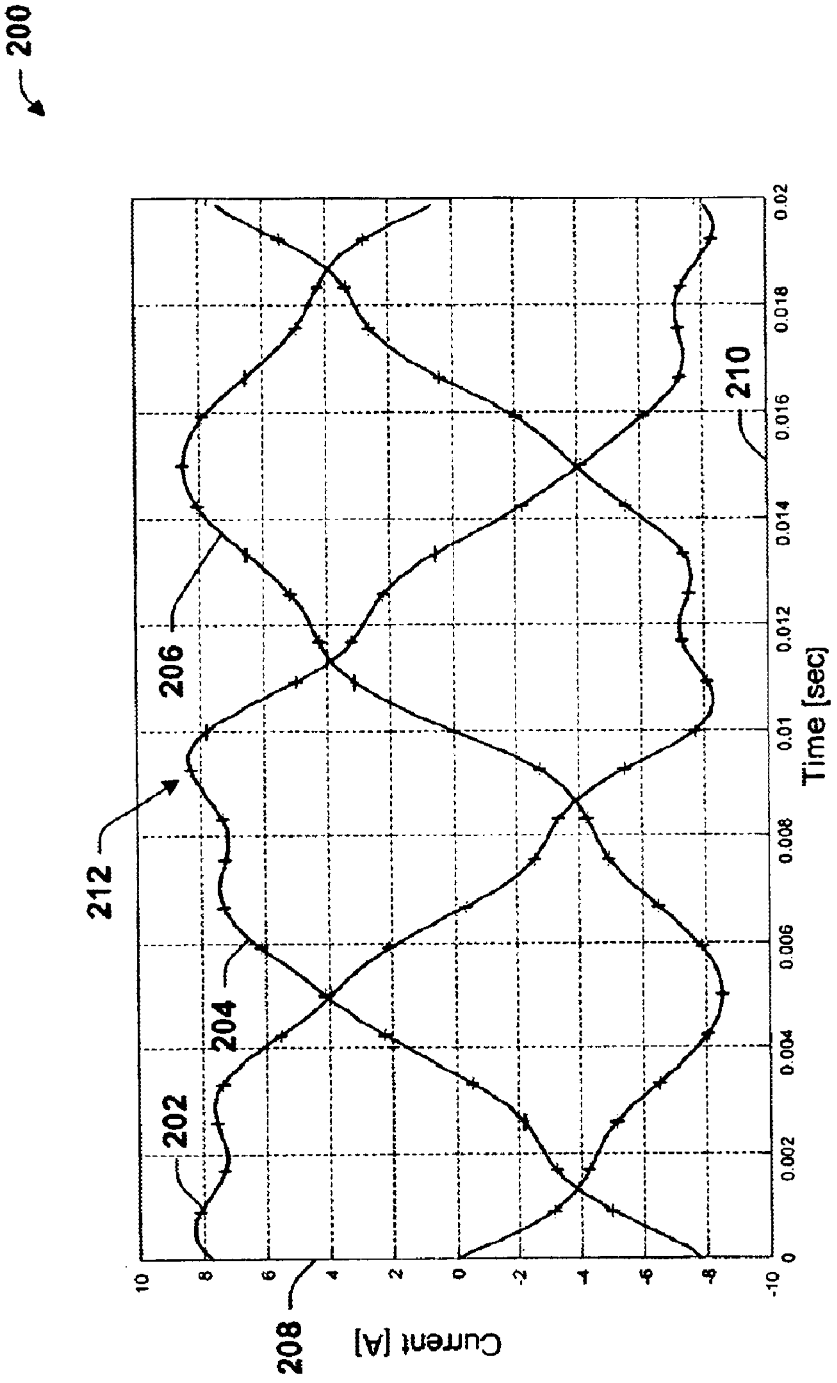
FIG. 8 is an exemplary plot illustrating sampled three phase currents with unbalanced harmonics in accordance with the invention.

$\Theta$ is the expected, undisturbed rotation of the space vector between successive samples of the space vector taken at intervals $t_s$ when the space vector is sampled, where $\Theta$ equals $\omega_s t_s$. FIG. 8 illustrates an exemplary plot 200 of three phase currents 202, 204, and 206 containing harmonics plotted as current 208 versus time 210 in the time domain. Instants of time at which samples for SVAF analysis are taken, are indicated with crosses 212, wherein there are 24 samples taken in the single cycle (e.g., at 50 Hz) illustrated.

Figure 9:
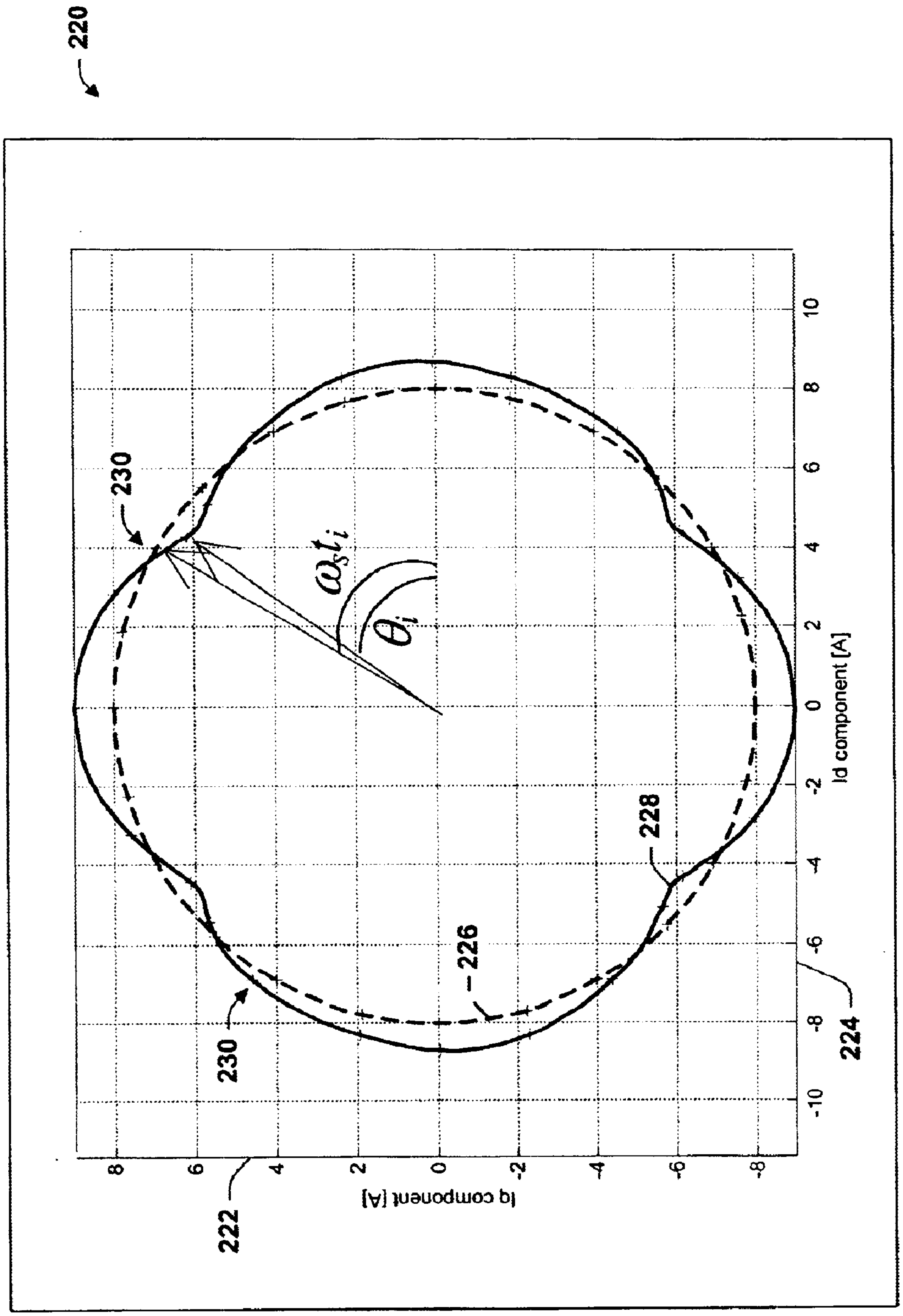
FIG. 9 is an exemplary plot illustrating sampled current space vectors for a balanced and an unbalanced system in accordance with the invention.
Figure 10:
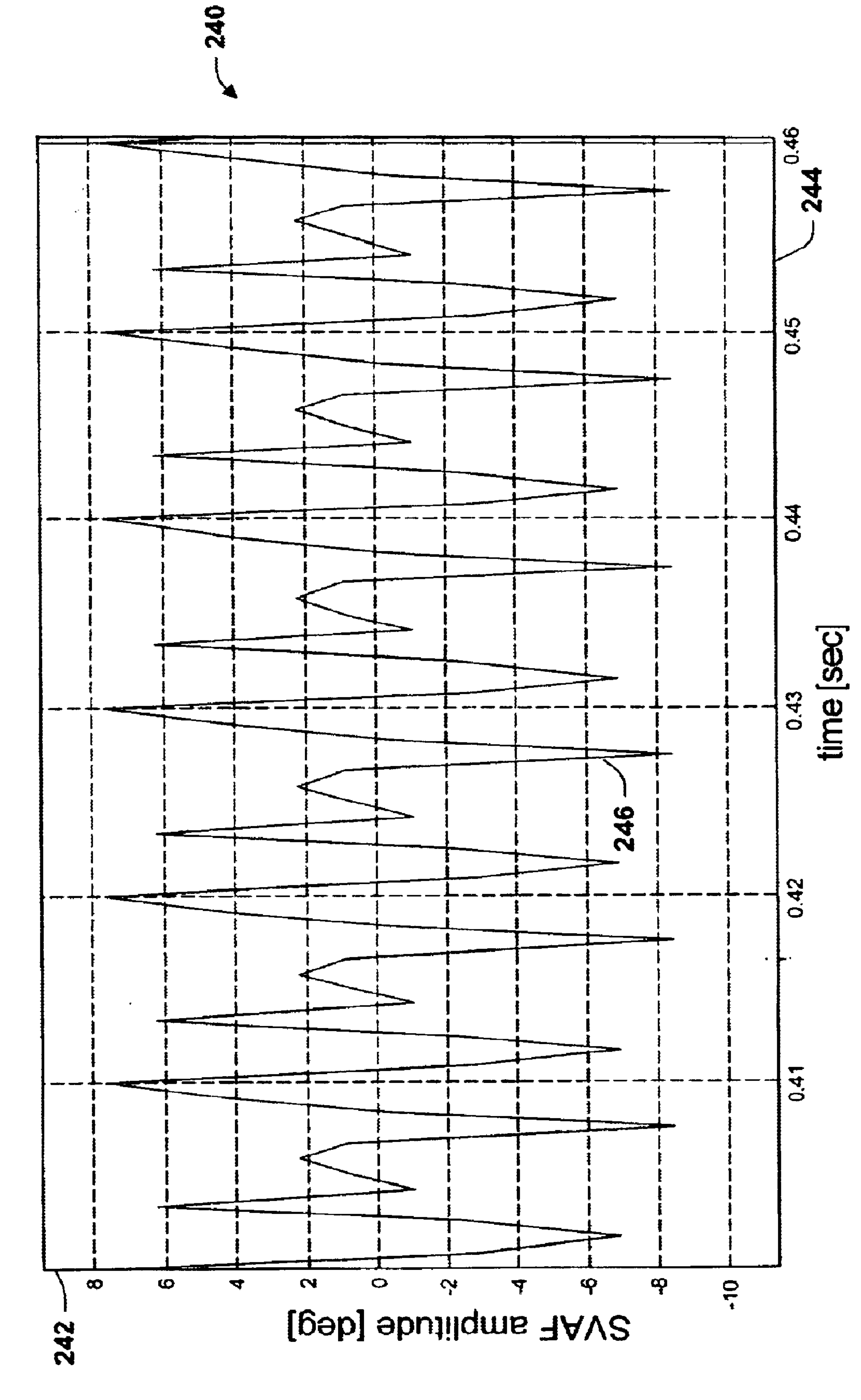
FIG. 10 is an exemplary plot illustrating space vector angular fluctuations in the time domain in accordance with the invention.

FIG. 9 illustrates an exemplary plot 220 of Iq component 222 versus Id component 224, wherein a circular space vector 226 is illustrated in dashed line for the case of an ideal balanced system without harmonics, and where an exemplary space vector 228 is illustrated for the case of three phase system with unbalanced harmonics (solid). Samples chosen for the SVAF calculations from the space vector circle are marked with crosses 230. Referring also to FIG. 10, an exemplary plot 240 of space vector angular fluctuations SVAF 242 versus time 244 illustrates sampled values $\delta\theta_i$ 246 presented in the time domain. With the SVAF techniques according to the present invention, it is possible to select any sampling frequency to sample the space vector circle, whereas the sample rate of the zero crossing times ZCT technique is limited. Thus, the frequency range in the spectrum of the SVAF signal may be extended, whereby aliasing from higher frequencies may be avoided.

Figure 11:
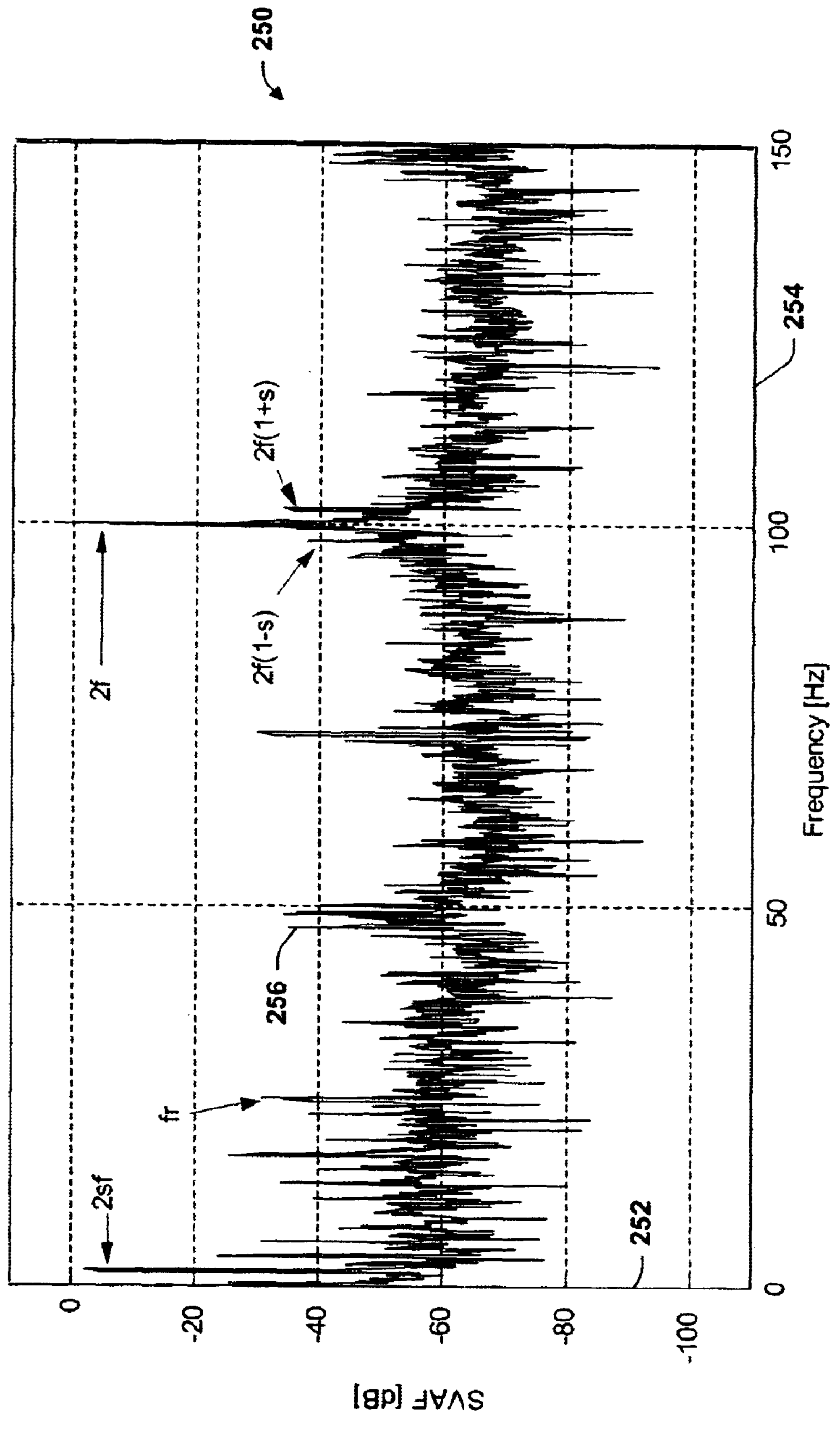
FIG. 11 is an exemplary plot illustrating frequency spectrum of space vector angular fluctuation with fault indicative frequencies in accordance with the invention.

As illustrated in FIG. 11, an exemplary plot 250 of SVAF 252 versus frequency 254 shows an exemplary frequency spectrum 256 of the space vector angular fluctuation. The inventors have found that one or more fault indicative frequencies are present in the SVAF spectrum 256. In addition, the spectral data includes lines at frequencies corresponding to the physical process. For example, torque fluctuations at shaft frequency will appear at exactly rotor frequency ($f_r$) compared to spectra from direct current sampling which provide this information as sidebands to the mains frequency, or its harmonics. Other frequencies of interest are illustrated and described in greater detail hereinafter.

Experimental data has been obtained using three induction motors, with special windings on the stator to enable stator fault experiments. A 4 hp motor was used in which slot windings were brought out to panel terminals, to allow short circuiting of selected slots to simulate a stator fault. The motor was connected as a four pole induction motor with stator windings in 46 slots, each slot having 64 turns. The rotor of the 4 hp motor was a wound rotor, which enabled the rotor circuit to be unbalanced by adding extra resistance to simulate rotor faults. Also used were a 2 hp, four pole induction motor, and a 2.2 kW, four pole induction motor, in which stator faults were simulated through taps on the winding, that could be connected to short circuit two, three, four or ten neighboring turns. A resistor was added to the shorting link to limit the fault current to protect the winding. In addition, rotor faults were simulated by cutting rotor bars.

With respect to stator fault detection, short-circuited turns on the stator of an induction motor cause asymmetry of the three phase stator winding. When explained by symmetrical components theory, the overall effect of such a fault is the presence of three phase negative sequence currents, as is known. Negative sequence currents rotate at angular frequency $(-\omega_s)$ and so does their corresponding space vector. Thus, the three phase system from equation (5) has negative sequence currents as additional components and angular fluctuations of the resultant space vector from equation (11) include terms with following frequency $\omega=\omega_s-(-\omega_s)=2\omega_s$. The spectrum of the SVAF signal will include a spectral component at $2f_s$, where $f_s$ is the frequency of power applied to the motor. The amplitude of this spectral component has been found by the inventors to change when a stator fault condition exists. Consequently, the amplitude of the SVAF at this frequency may be employed as a diagnostic measure for such stator faults.

To monitor stator faults in real time, the changes of the $2f_s$ amplitude may be monitored. The Goertzel algorithm may be employed to extract this spectral component amplitude information using data sampled over a single supply cycle. The Goertzel algorithm advantageously provides expression of the computation of the DFT as a linear filtering operation. This may be used, for example, when the DFT is to be computed from a sequence of N samples, at a relatively small number M of values, where $M \leqq \log_2 N$. In the present example, M=1 since only one DFT value is needed from the block of input data. The length of the input data is N=6 for the ZCT method, or more for SVAF method, depending on the selected sampling rate. The Goertzel algorithm may thus be more efficient than the FFT algorithm for this type of calculation. Where the spectral information is thus obtained, e.g., through monitoring the behavior of one spectral frequency or component over a period of one mains cycle, a very fast response time results, making it suitable for real time, on-line detection of stator faults.

Figure 12:
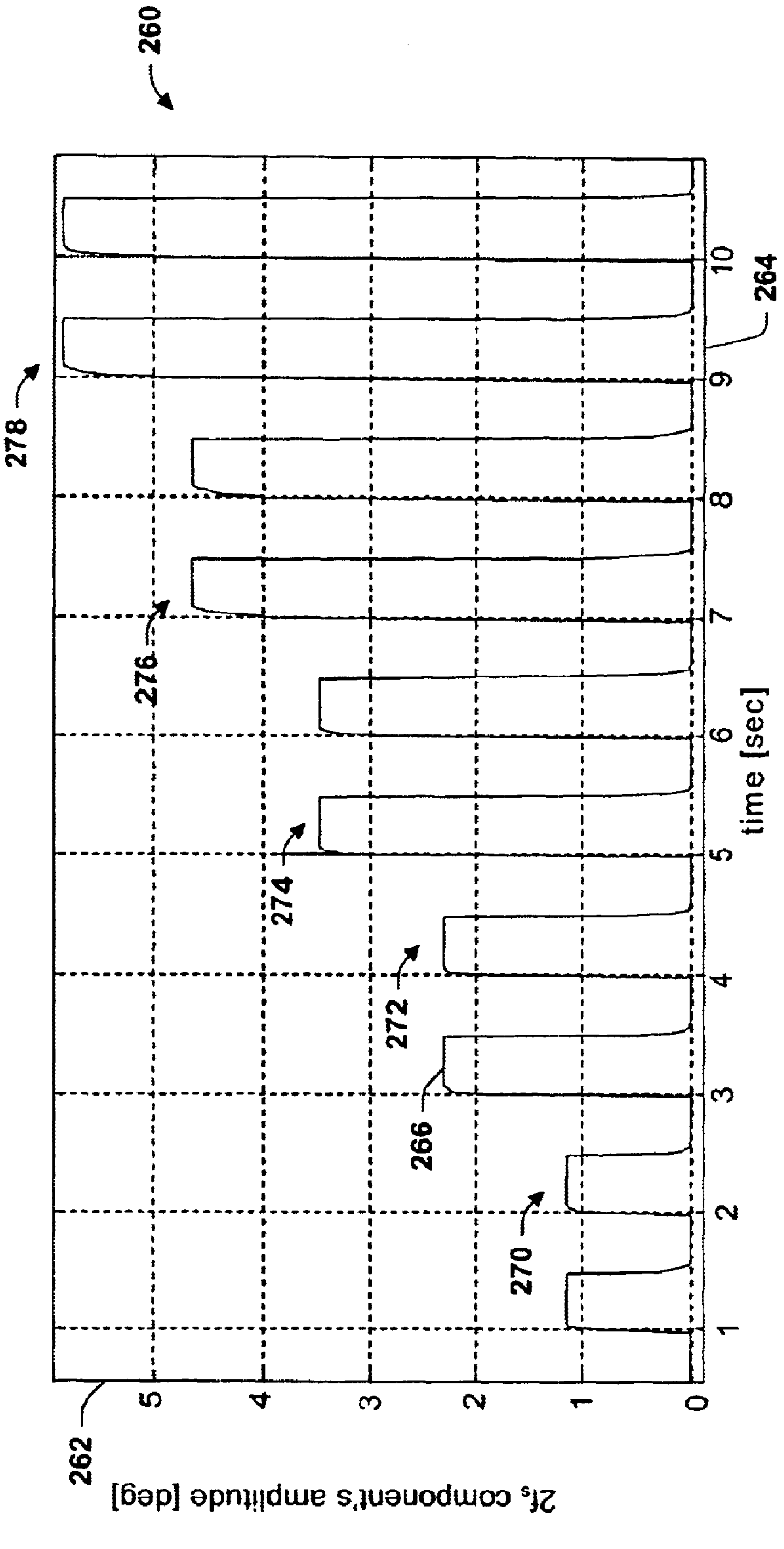
FIG. 12 is an exemplary plot illustrating an exemplary $2f_s$ real time component obtained via a Goertzel algorithm in accordance with the invention.

An induction motor with 252 turns in each stator phase was simulated. One, two three, four and five turns respectively were short-circuited in a computer model and the results are illustrated in FIG. 12 as an exemplary plot 260 of $2f_s$ component amplitude 262 versus time 264. The $2f_s$ diagnostic metric 266 was extracted on-line and its amplitude plotted, wherein the SVAF technique responds virtually immediately to various stator faults 270, 272, 274, 276, and 278, corresponding to 1, 2, 3, 4, and 5 of 252 turns shorted, respectively, in the motor. The SVAF methodology detects the first supply cycle having increased negative sequence current, which is reflected in the diagnostic index 266 (e.g., SVAF spectral component amplitude fluctuation), as illustrated in FIG. 12. The number of shorted turns, e.g., the severity of the fault, is also indicated with rise in the amplitude of this index 266, wherein the fault was alternatively switched on and off twice in FIGS. 12 and 14 for each severity of the fault.

Figure 13:
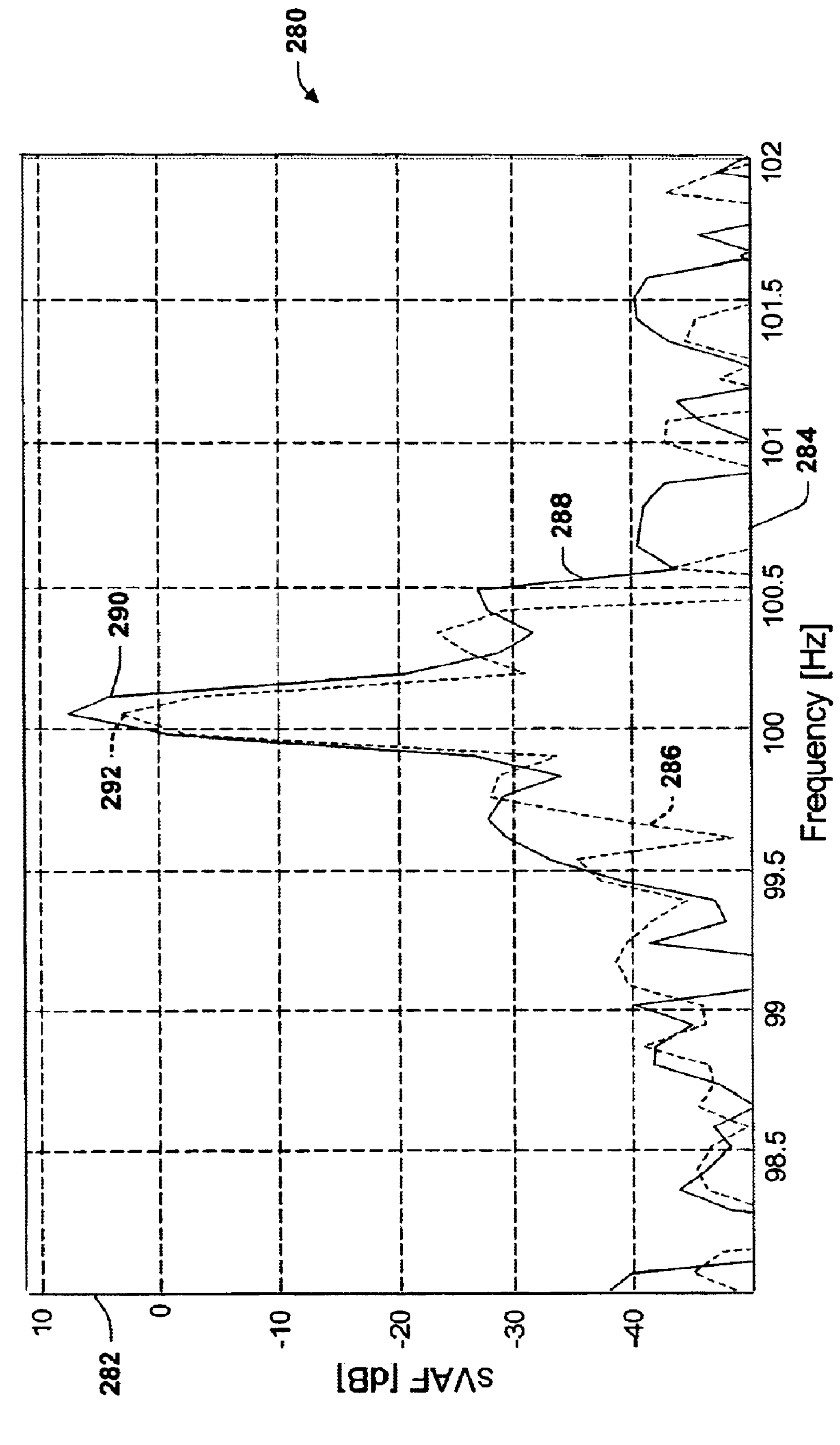
FIG. 13 is and exemplary plot illustrating a fluctuation in amplitude of a $2f_s$ component due to stator fault in accordance with the invention.
Figure 14:
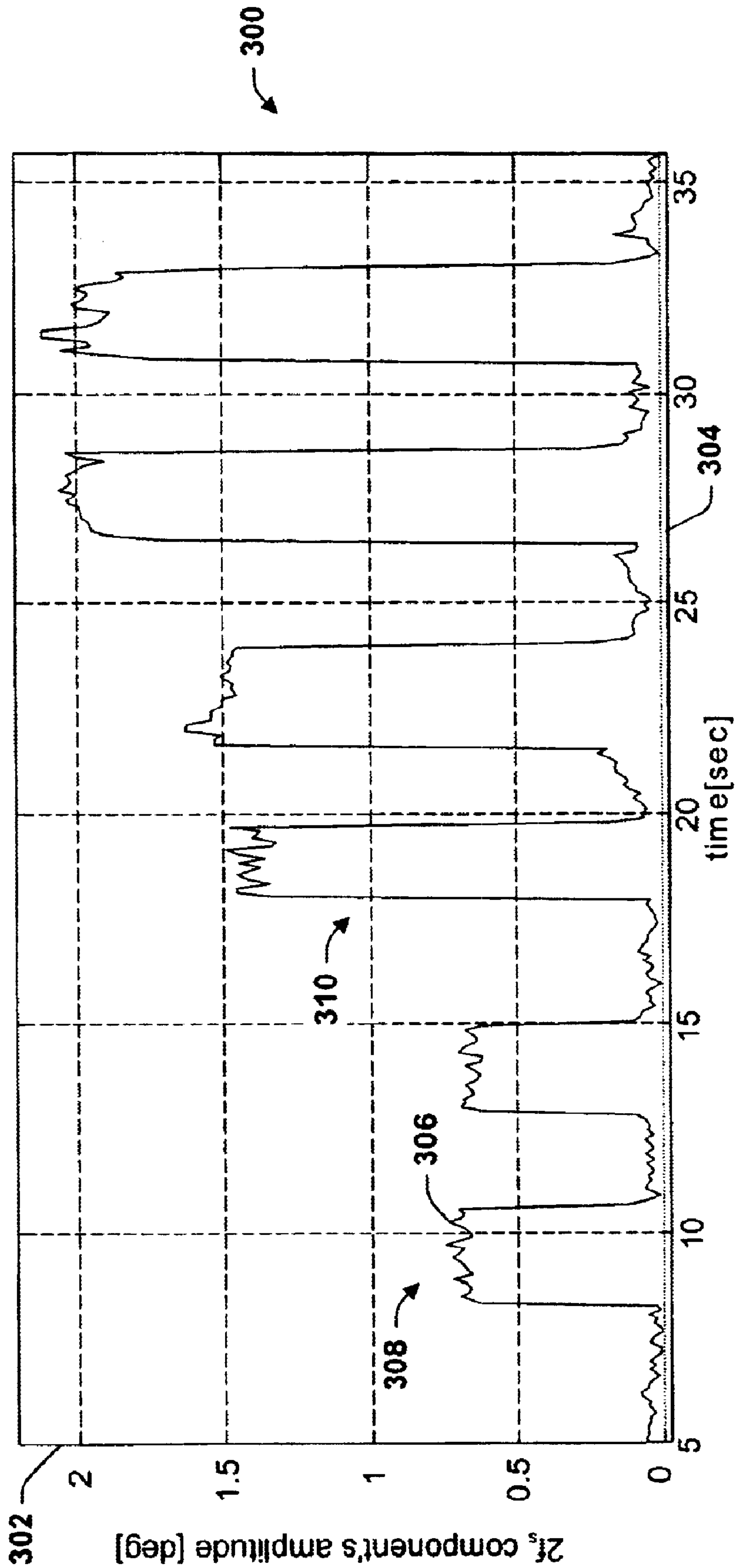
FIG. 14 is an exemplary plot illustrating another exemplary $2f_s$ real time component obtained via a Goertzel algorithm in accordance with the invention.

FIG. 13 illustrates an exemplary plot 280 of SVAF 282 versus frequency 284, centered around the $2f_s$ frequency of 100 HZ, wherein a spectrum 286 is illustrated in dashed line for a healthy motor, and an SVAF spectrum 288 is illustrated for the motor with a stator short circuit (solid), for 1.4% of phase voltage short-circuited turns, as obtained experimentally. As illustrated, the amplitude 290 of the component at approximately $2f_s$ for the faulted motor is higher than the corresponding amplitude 292 for the healthy motor. Further experimental results are illustrated in FIG. 14 as an exemplary plot 300 of $2f_s$ component amplitude 302 versus time 304, wherein the $2f_s$ diagnostic metric 306 was extracted on-line and its amplitude plotted. The SVAF technique responds quickly to various stator faults 308, 310, and 312, corresponding to 0.7%, 1.05%, and 1.4% of stator turns shorted, respectively, in the motor.

The SVAF technique may further be employed to detect problems associated with unbalanced supply voltages, and to distinguish such faults from stator faults in accordance with another aspect of the invention. When the supply voltage is unbalanced and contains negative sequence voltages, negative sequence currents result on the stator of the induction motor. The $2f_s$ current component amplitude is directly affected when the supply voltage is unbalanced. The invention further provides for distinguishing stator faults from supply unbalance conditions based on angular fluctuations in current and voltage space vectors.

For instance, analysis of diagnostic index $2f_s$ from voltage space vector angular fluctuations may be combined with analysis of diagnostic index $2f_s$ from the current space vector angular fluctuations, to classify the condition affecting the motor. In this regard, the inventors have found that a sudden change in the current $2f_s$ spectral component amplitude occurring within one supply cycle with a corresponding sudden change in the voltage $2f_s$ spectral component amplitude indicates an unbalanced condition, whereas a sudden change in the current $2f_s$ spectral component amplitude occurring within one supply cycle without such a corresponding sudden change in the voltage $2f_s$ spectral component amplitude indicates a stator fault. Thus, fuzzy logic systems or other techniques may be employed in the diagnostic component in order to distinguish unbalanced power and stator fault conditions in accordance with the present invention.

The invention further provides for detection and/or diagnosis of rotor problems or faults within an electric motor using space vector angular fluctuation. The existence of a rotor cage fault has been found to cause an electrical asymmetry of the rotor circuit of a motor. This asymmetry gives rise to a $(1-2s)f_s$ spectral component in the stator current, wherein the amplitude of these sidebands reflects the extent of the rotor asymmetry. For instance, the interaction of the $(1-2s)f_s$ harmonic of the motor current with the fundamental air-gap flux produces speed ripple at $2sf_s$ and gives rise to additional motor current harmonics at frequencies given by the following equation (14):

$$f_{rb}=(1+2ks)f_s,\ k=1,2,3 \tag{14}$$

The three phase system of currents from (5), for rotor fault, includes additional components at angular frequency $\omega_{comp.}=(1-2s)\,\omega_s$ and the space vector angular fluctuation from equation (11) holds sinusoidal components at $\omega'=\omega_s-\omega_{comp.}=2s\omega_s$ and its multiples. Spectral analysis of the experimental SVAF signals with rotor asymmetry confirms that this component appears in the spectrum of the SVAF signal and may be used as a diagnostic index for rotor faults. In addition, spectral components at sidebands $(1-s)2f_s$ and $(1+s)2f_s$, appear around $2f_s$ in the SVAF spectrum and their amplitude increases with the severity of the rotor asymmetry. The origin of these sidebands can be found when current space vector spectrum is analyzed. For instance, if the motor is supplied from a non-ideal power source, e.g., one which has negative sequence current on the stator due to the negative sequence voltage, negative sidebands $-(1-2s)2f_s$ and $-(1+s)2f_s$ are found in the motor current spectrum. Thus, the SVAF spectrum includes $\omega'=\omega_s-\omega_{comp.}=\omega_s-[-(1\pm 2s)\omega_s]=(1\pm s)2\omega_s$ components. Modulation of the $2f_s$ component in the SVAF spectrum by these sidebands causes $2sf_s$ ripple in the $2f_s$ component, giving an indication of the rotor unbalance, when this frequency component is monitored on-line.

Figure 15:
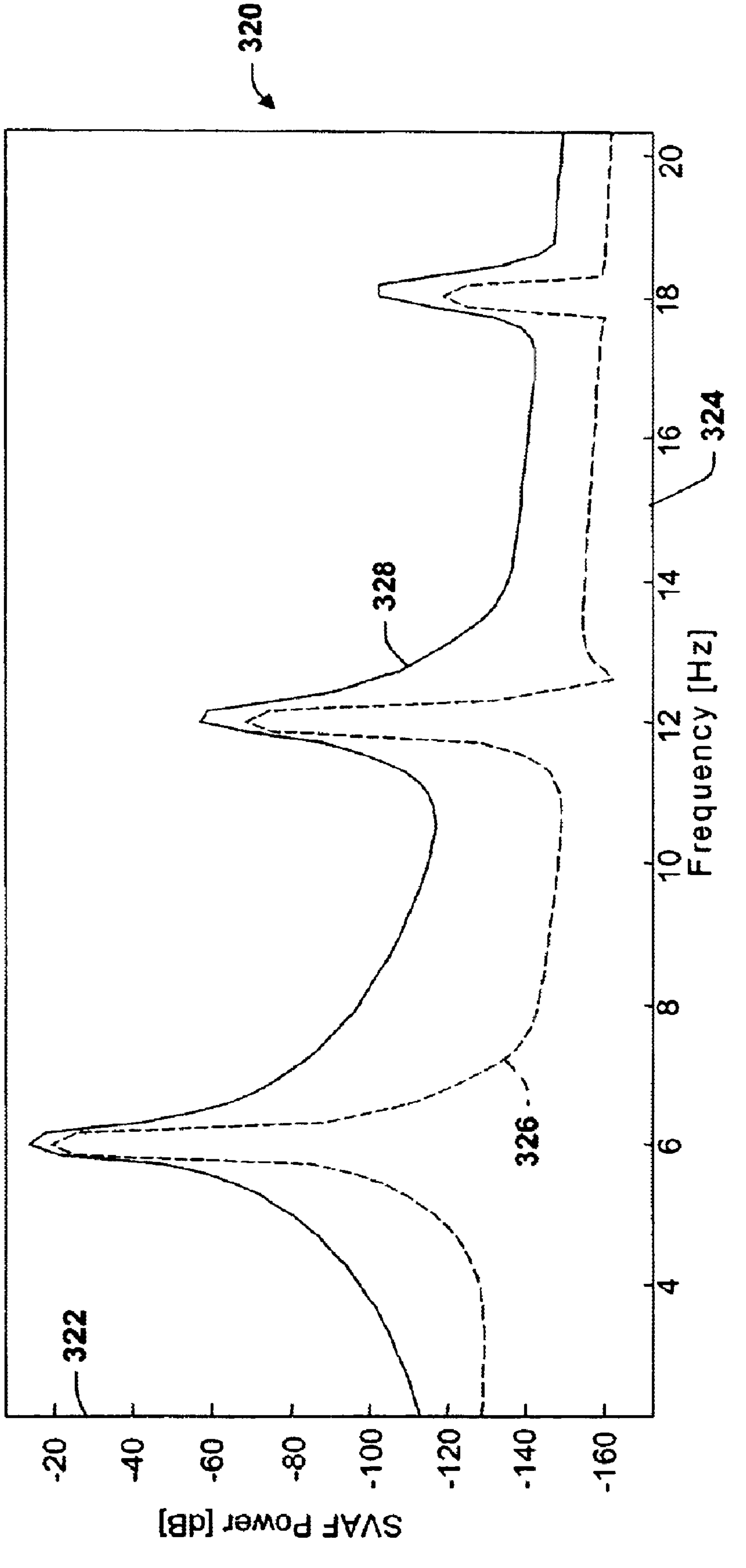
FIG. 15 is an exemplary plot illustrating an amplitude fluctuation in $2sf_s$ and $4s_s$ components due to rotor resistance imbalance according to the invention.
Figure 16:
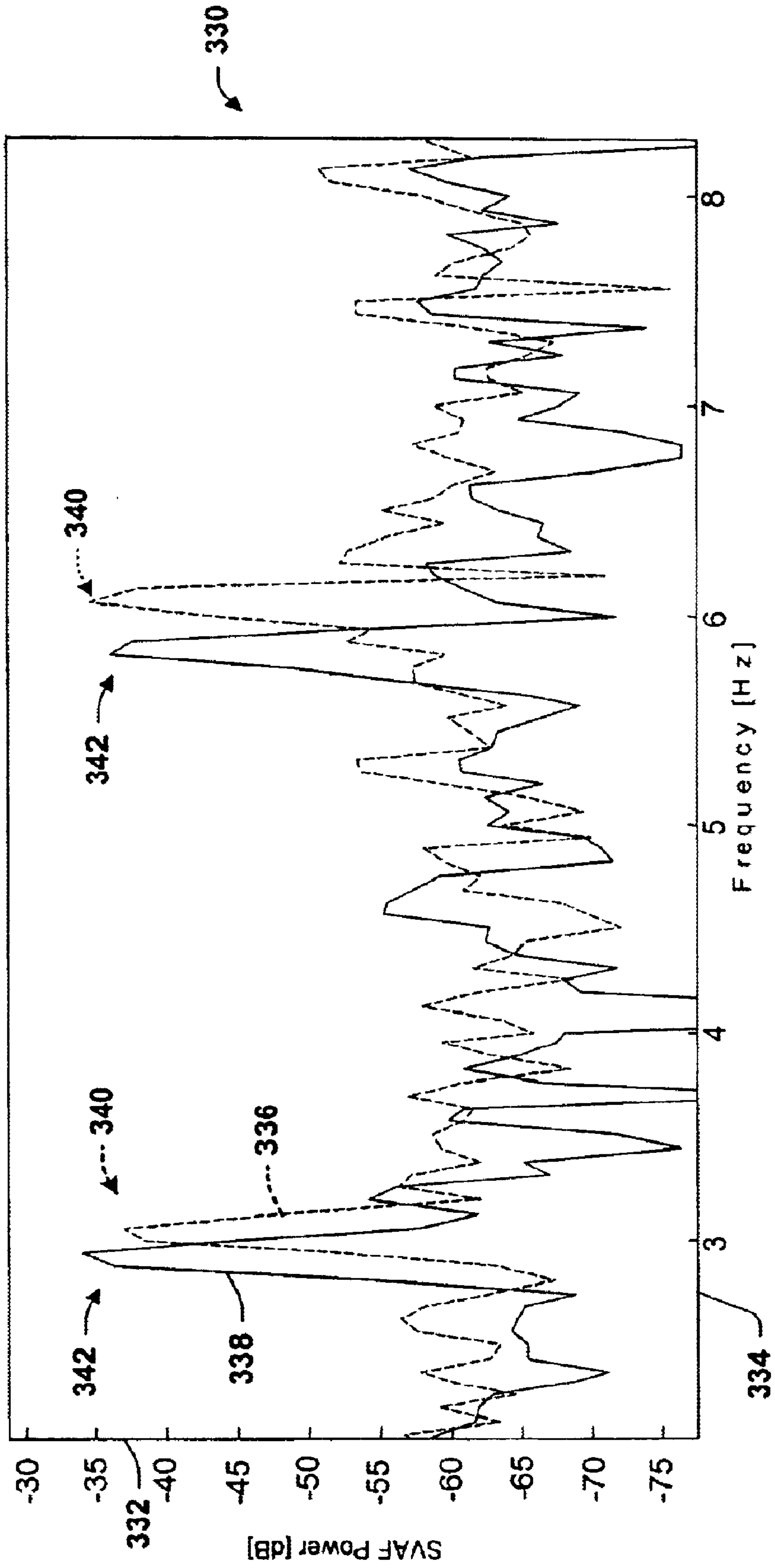
FIG. 16 is an exemplary plot illustrating an amplitude fluctuation in $2sf_s$ and $4sf_s$ components due to a broken rotor bar in accordance with the invention.

Referring now to FIGS. 15–26, an exemplary plot 320 is illustrated in FIG. 15 as SVAF power 322 versus frequency 324, wherein a spectrum 326 for a mildly unbalanced rotor is shown in dashed line, and a spectrum 328 is shown for a rotor having greater imbalance, obtained by simulation. For the simulation, different amounts of rotor unbalance were created with respect to a healthy rotor resistance of $R_r'=0.816$ Ohm. The first case of unbalance 326 assumes added resistance of $\Delta R_r'=0.1$ Ohm in one rotor phase, while in the second case 328, an added resistance of $\Delta R_r'=0.2$ Ohm is used. Twice the slip frequency is 6 Hz, and sidebands to the $2f$component occur correspondingly at 94 Hz and 106 Hz for a source frequency of 50 Hz. FIG. 16 illustrates an exemplary plot 330 of SVAF power 332 versus frequency 334, wherein a rise in the $2sf_s$ and $4sf_s$ spectral components is seen due to one broken bar. A normal spectrum 336 is illustrated in FIG. 16 in dashed line together with a faulted motor spectrum 338. As illustrated in FIG. 16, the peak 340 for the normal motor is lower than the peak 342 for the faulted motor case.

Figure 17:
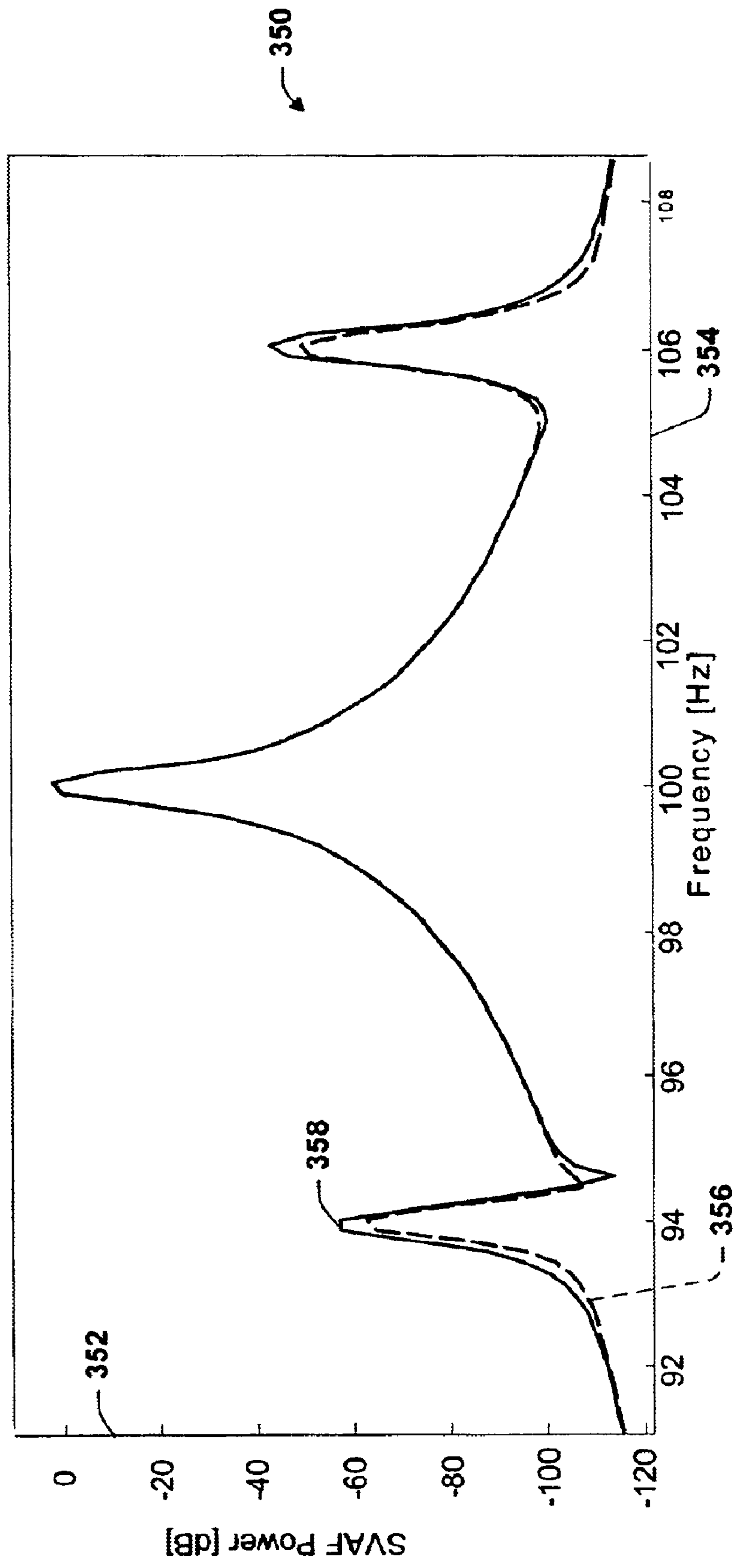
FIG. 17 is an exemplary plot illustrating sidebands due to rotor resistance. imbalance in accordance with the invention.
Figure 18:
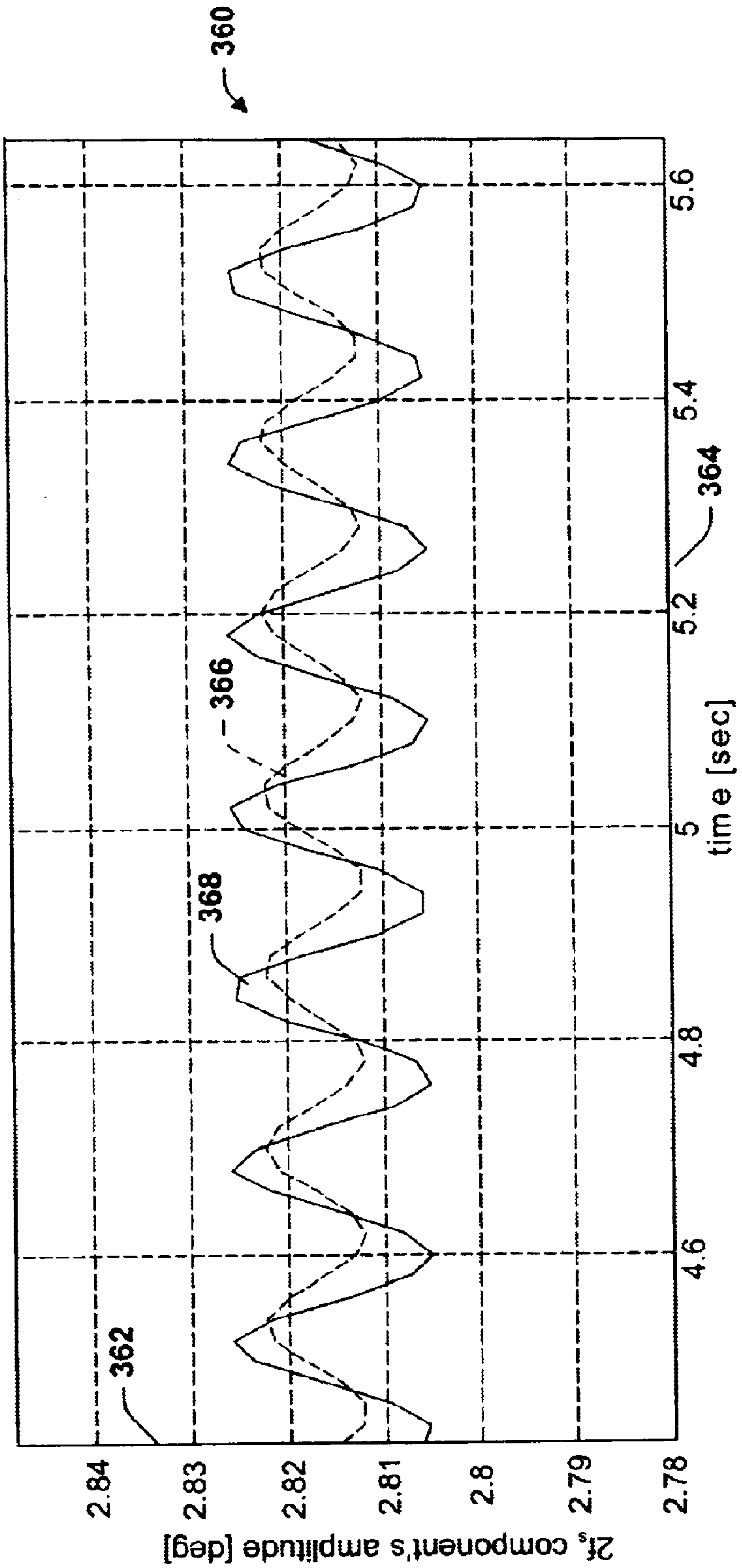
FIG. 18 is an exemplary plot illustrating oscillation of $2f_s$ component at $2sf_s$ frequency due to rotor asymmetry in accordance with the invention.
Figure 19:
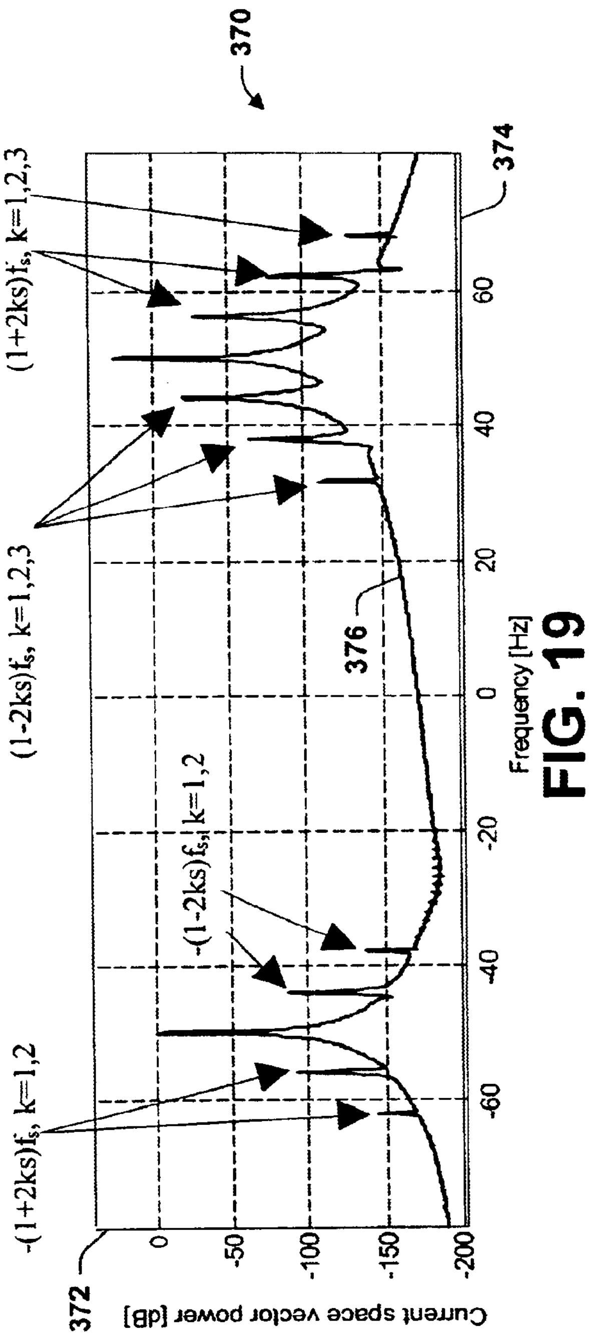
FIG. 19 is an exemplary plot illustrating a current space vector spectrum in accordance with the invention.

FIG. 17 illustrates an exemplary plot 350 of SVAF power 352 versus frequency 354, wherein a rise in the $(1-s)\,2f_s$ and $(1+s)\,2f_s$ sidebands is illustrated from the mild rotor resistance imbalance spectrum 356 to a spectrum 358 for higher degree of imbalance, for the imbalance conditions discussed above with respect to FIG. 15. In FIG. 18, a plot 360 of SVAF power 362 versus time 364 illustrates oscillations of the $2f_s$ component at $2sf_s$ frequency, via mild imbalance curve 366 and higher imbalance curve 368 for the same degrees of rotor resistance unbalance. FIG. 19 provides a plot 370 of current space vector power 372 versus frequency 374 illustrating an exemplary current space vector spectrum 376, and FIG. 20 provides a plot 380 of voltage space vector power 382 versus frequency 384 illustrating a voltage space vector spectrum 386.

Figure 20:
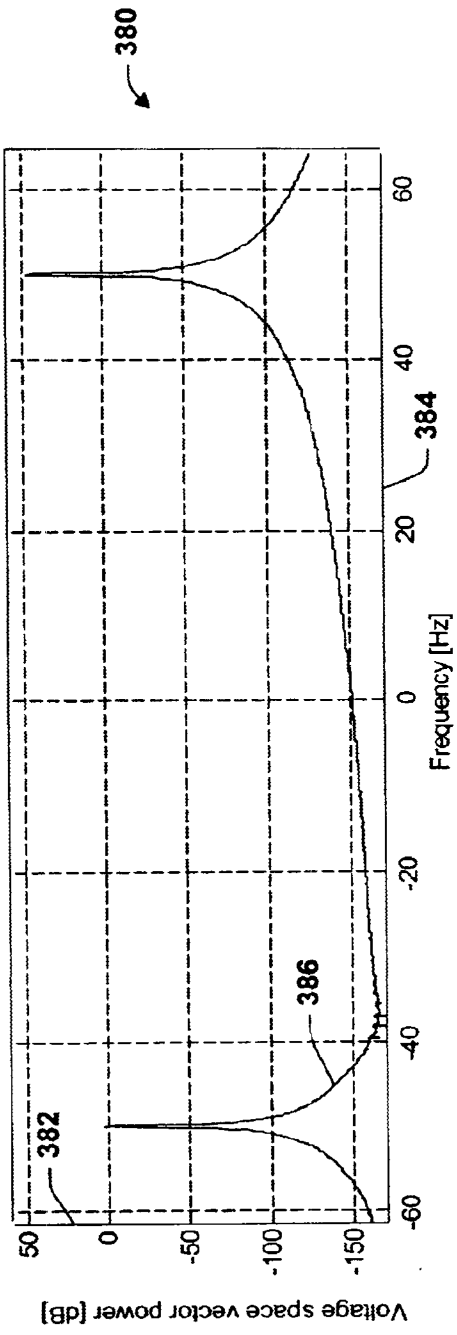
FIG. 20 is an exemplary plot illustrating a voltage space vector spectrum in accordance with the invention.
Figure 21:
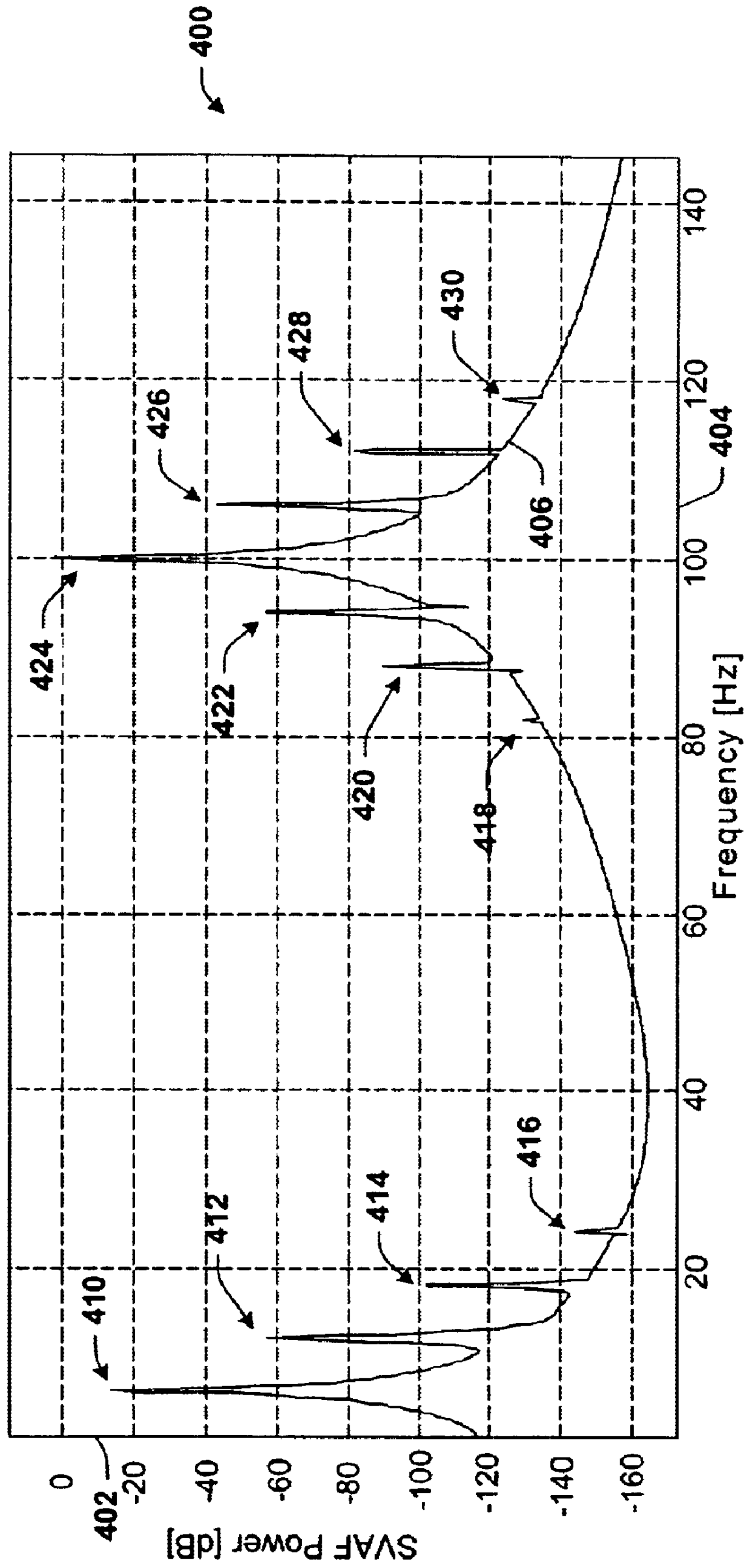
FIG. 21 is an exemplary plot illustrating a space vector angular fluctuation spectrum with components due to rotor imbalance in accordance with the invention.

FIGS. 19 and 20 illustrate the spectrum of the current and voltage space vectors, respectively, under unbalanced rotor ($\Delta R_r'=0.1$ Ohm) and unbalanced voltage supply condition of 0.6%, wherein supply voltage unbalance condition is the ratio of negative to positive sequence voltage. This voltage negative sequence causes 4.86% unbalance in the stator currents. A spectral component at (−50 Hz) is present in the spectrum of the voltage space vector, as well as in the spectrum of the current space vector. Negative sidebands $-(1-2s)f_s$ and $-(1+2s)f_s$ in the current spectrum are also distinguishable. These cause sidebands $(1-s)2f_s$ and $(1+s)$ $2f_s$ in the SVAF spectrum, which are shown on the FIG. 21, which provides a plot 400 of SVAF power 402 versus frequency 404. As illustrated in the spectrum 406 of FIG. 21, spectral components 410, 412, 414, 416, 418, 420, 422, 424, 426, 428, and 430 are seen for $2sf_s$, $4sf_s$, $6sf_s$, (1−s) $6f_s$, (1−s) $4f_s$, (1−s) $2f_s$, (1+s) $2f_s$, (1+s)$4f_s$, and (1+s)$6f_s$, respectively.

Figure 22:
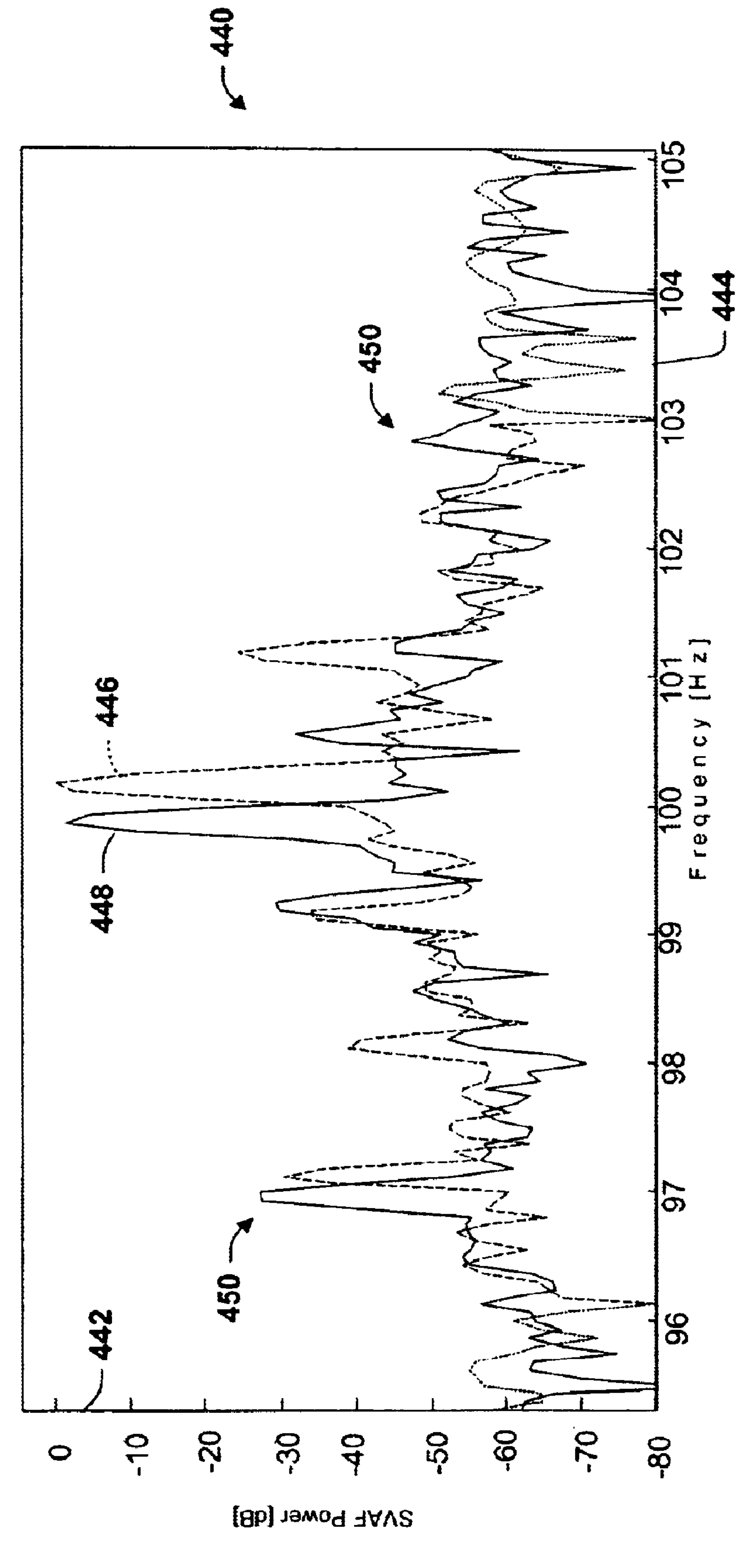
FIG. 22 is an exemplary plot illustrating an amplitude fluctuation in $(1-s)2f_s$ and $(1+s)2f_s$ components due to a broken rotor bar in accordance with the invention.
Figure 23:
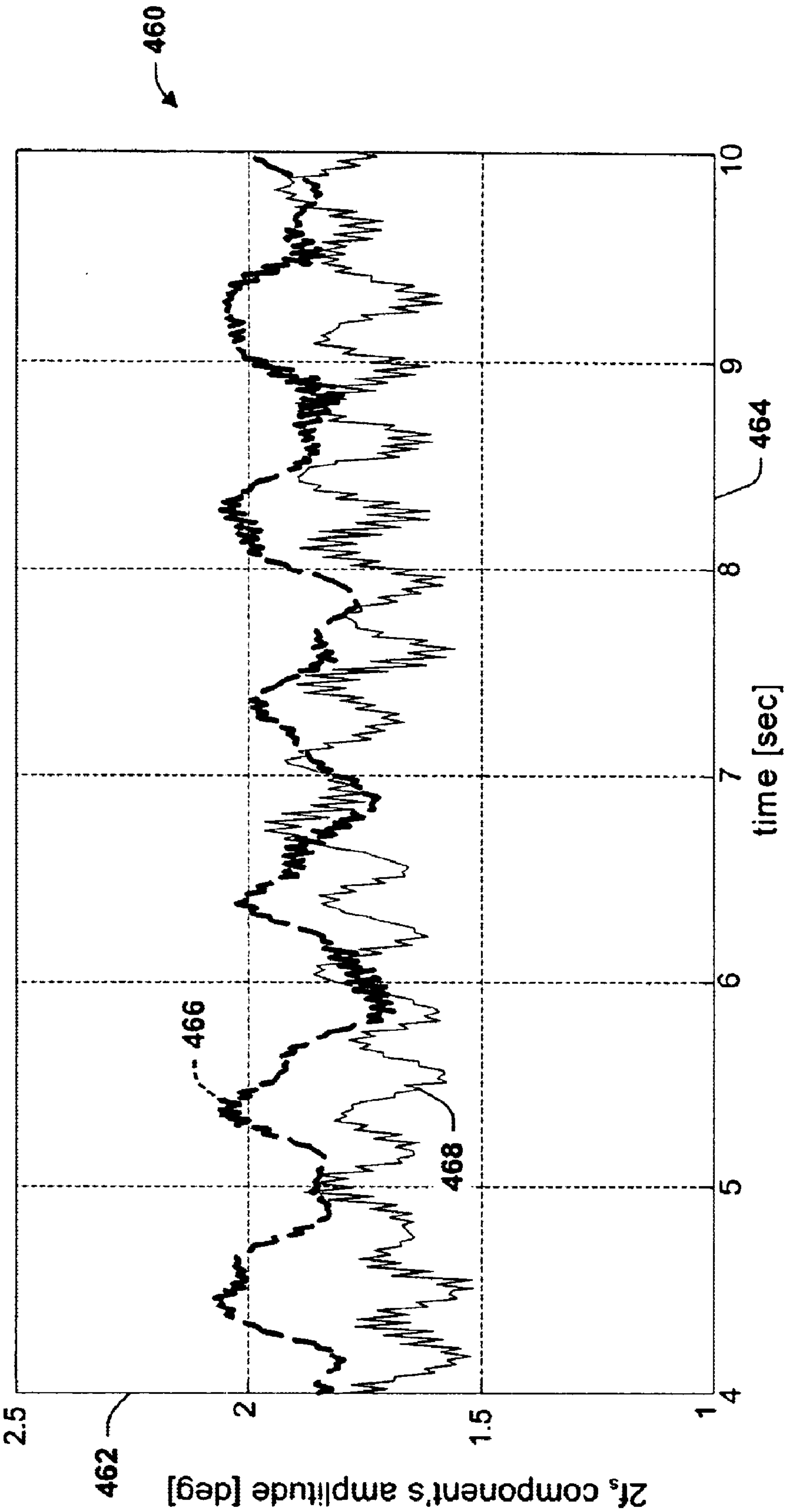
FIG. 23 is an exemplary plot illustrating oscillation of a $2f_s$ component at $2sf_s$ frequency due to a broken rotor bar in accordance with the invention.

FIG. 22 illustrates a plot 440 of SVAF power 442 versus frequency 444 for a normal motor spectrum 446 and a broken bar fault spectrum 448, wherein fault indicative frequency spectrum components 450 are illustrated. Results presented are for normal condition on the motor and for one broken rotor bar, out of twenty six. Supply voltage is 1% unbalanced. FIGS. 16 and 22 show $2sf_s$, and (1−s) $2f_s$ and (1+s) $2f_s$ spectral components, respectively. FIG. 23 illustrates a plot 460 of $2f_s$ component amplitude 462 versus time 464 for a normal motor 466 and for a motor having one broken bar 468.

Figure 24:
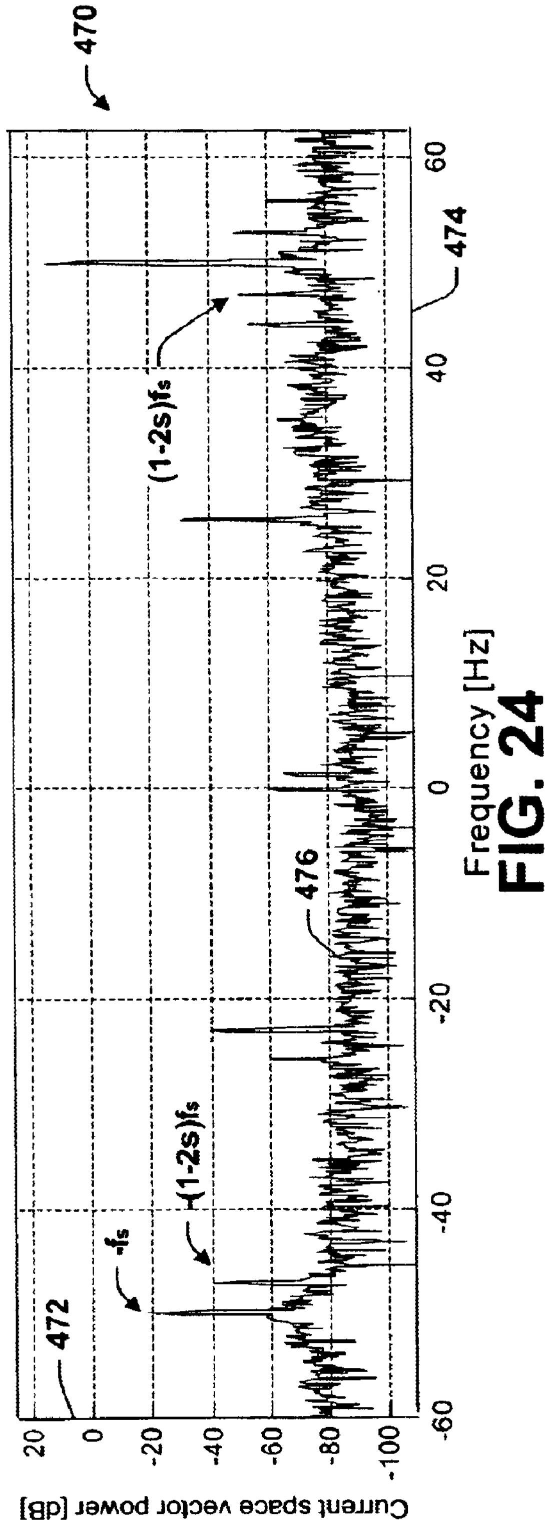
FIG. 24 is an exemplary plot illustrating a current space vector spectrum in the presence of a broken rotor bar in accordance with the invention.
Figure 25:
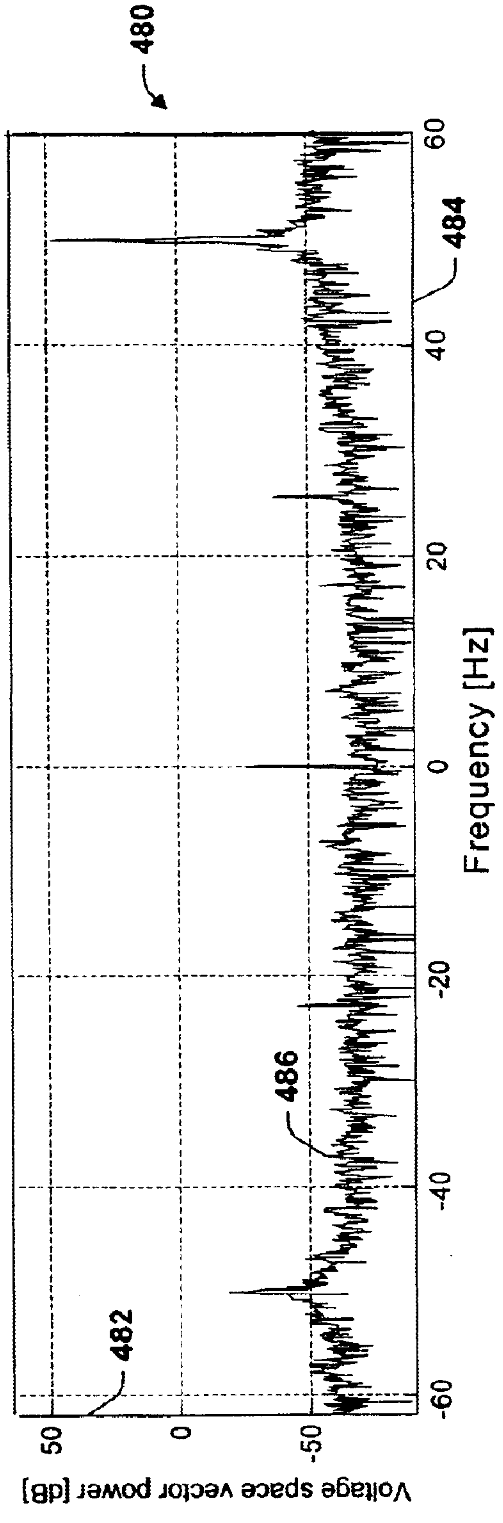
FIG. 25 is an exemplary plot illustrating a voltage space vector spectrum in the presence of a broken rotor bar in accordance with the invention.
Figure 26:
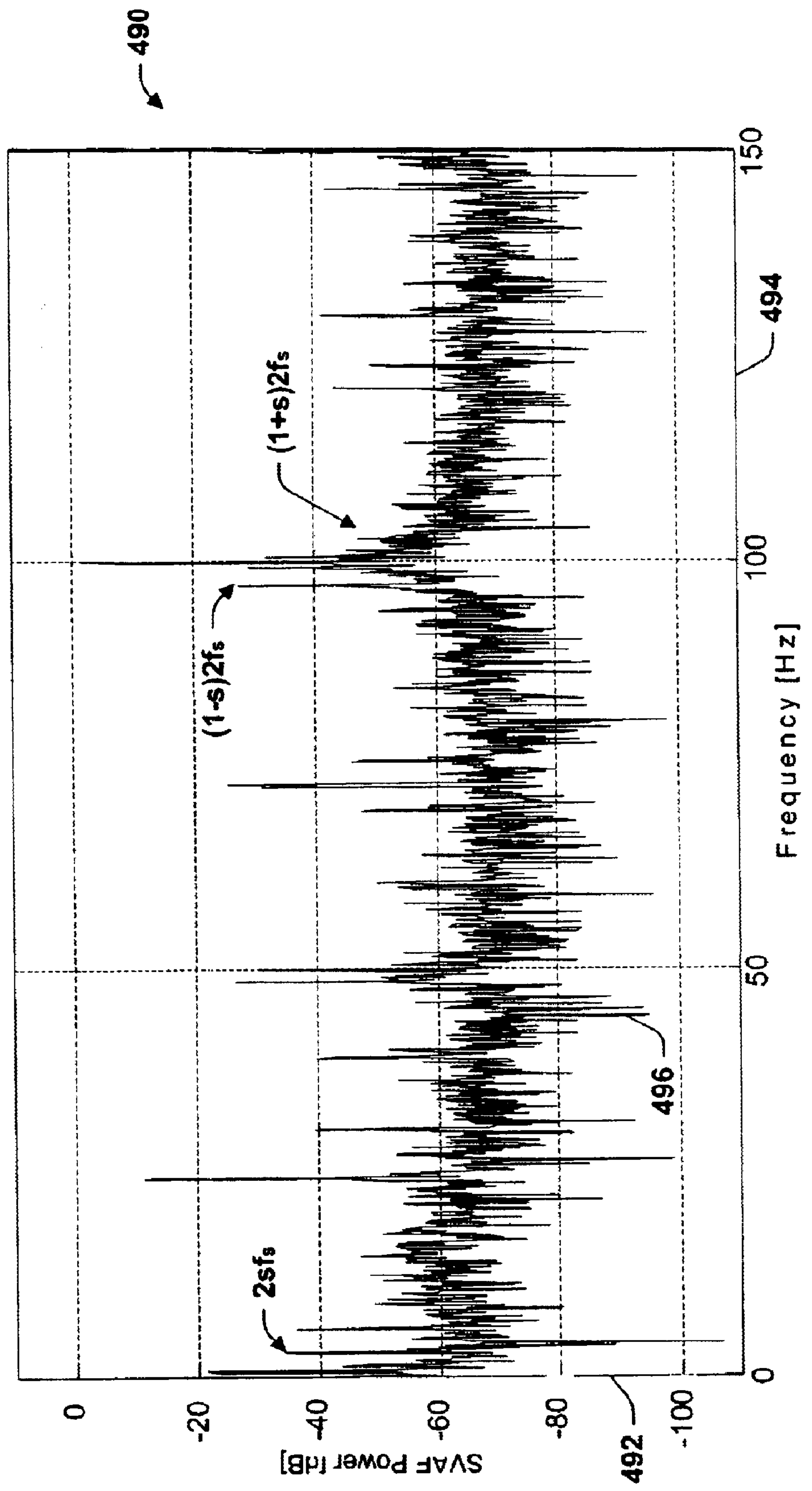
FIG. 26 is an exemplary plot illustrating a space vector angular fluctuation spectrum in the presence of a broken rotor bar in accordance with the invention.

Finally, complex spectra of the current and voltage space vectors are presented on FIGS. 24 and 25, respectively. FIG. 24 includes a plot 470 of current space vector power 472 versus frequency 474 showing a spectrum 476, and FIG. 25 illustrates a plot 480 of voltage space vector 482 versus frequency 484 with a spectrum 486. Negative sequence current and voltage, as well as -(1−2s)$f_s$ negative current sideband can be clearly be seen. FIG. 26 presents full spectrum with rotor fault indicative frequencies, wherein a plot 490 of SVAF power 492 versus frequency 494 illustrates a spectrum 496.

The angular fluctuations of the induction motors current space vector may thus be employed in accordance with the invention as diagnostic data for stator and rotor induction motor faults, as well as for diagnosing unbalanced supply conditions. The SVAF methodology allows monitoring of fault indicative changes in the diagnostic data, through analyzing characteristic frequencies in the spectrum of the space vector angular fluctuations. The following table summarizes various diagnostic indices for stator and rotor faults which may be detected according to the invention:

TABLE 1

DIAGNOSTIC INDICES FOR SVAF METHOD

| Diagnostic index | Origin of index | Required for | Monitoring type | Trend |
|---|---|---|---|---|
| Current SVAF $2f_s$ | Current neg. sequence | Stator fault | Real time | Increase with current or voltage neg. sequence (without increase in Voltage SVAF $2f_s$) |
| Voltage SVAF $2f_s$ | Voltage neg. sequence | Stator fault | Real time | Increase with voltage neg. sequence (For use with Current SVAF $2f_s$) |
| Current SVAF $2sf_s$ | (1 − 2s)$f_s$ current sideband | Rotor fault | On-line spectrum | Increase with fault |
| Current SVAF (1 − s )$2f_s$ | -(1 − 2s)$f_s$ current sideband | Rotor fault | On-line spectrum | Increase with fault |
| Current SVAF (1 + s)$2f_s$ | -(1 + 2s)$f_s$ current sideband | Rotor fault | On-line spectrum | Increase with fault |

Stator faults may thus be indicated in the spectrum as change of the $2f_s$ and other component amplitudes. The Goertzel algorithm may be advantageously employed to extract the component's amplitude from the signal during each cycle of the mains supply. his avoids lengthy procedure required for creating frequency spectrum by Fourier Transformation as well as allowing real-time monitoring of motor faults. The $2f_s$ component will respond to the change in the angular fluctuations as soon as fault happens, allowing fast recognition in accordance with the present invention. The recognition process may include angular fluctuations of the voltage space vector, since voltage unbalance and load changes will affect this frequency. Rotor faults are indicated in the current space vector angular fluctuations spectrum with spectral lines at $2sf_s$ [corresponding to components at (1−2s)$f_s$ and (1+2s)$f_s$ in the spectrum from the current of a single motor phase ]. In the presence of supply unbalance SVAF components at (1−2s)$2f_s$ and (1+s)$2f_s$, correspond to spectral lines at -(1−2s)$f_s$ and -(1+2s)$f_s$ in the motor current space vector spectrum. Additionally, oscillation of the $2f_s$ SVAF spectral component at a frequency $2sf_s$ when monitored during each cycle, gives indication of the rotor unbalance in real-time.

Another examplary technique showing the diagnostic capabilities according to the invention is a fuzzy logic stator fault detector (FLSFD). In an ideal system, ZCT and SVAF signals are zero. Deviation from zero shows an unbalance in the system. In a real induction motor, there is always a small amount of unbalance in the phase currents. This small amount of unbalance is due to the inevitable unbalance in the supply network and inherent asymmetry of the induction motor itself. Since the perfectly balanced induction motor does not exist in a real, practical environment, ZCT and SVAF signals always exist and can be measured even in a nearly balanced working condition. A nearly balanced working condition is defined as a healthy, working condition that is as close to being perfectly balanced as reasonably possible. Since a perfectly balanced system is not realistic, using a diagnostic signal whose health value is being equal to zero would not be practical. Thus, rules for the FLSFD are not based on the value of the amplitude of the current ZCT or SVAF signal.

For a stator fault, such as a short circuit between two adjacent turns within the coil of the stator winding, it is likely that the shorting will extend to other turns in the vicinity causing a sudden increase of negative sequence current and amplitude of the SVAF signal. Thus, fuzzy rules are written for the degree of change of the ZCT and SVAF amplitude.

Negative sequence voltage is not induced nor is thte supply voltage affected by an short circuit in the stator windings. A sudden increase the SVAF current signal is an indicator of a stator fault. Further, a sudden increase in the ZCT and SVAF current signals is an indicator fro the unbalance originating from the supply network. Load variations are not expected to be sudden for constant load operation conditions. Through this logic, stator fault is isolated from other conditions causing unbalances. A sudden increase or change is defined as the difference in the amplitude between two consecutive SVAF samples which is greater than the value of a defined threshold parameter. The threshold parameter is set in order-to tolerate the normal fluctuations and yet be sensitive enough to detect the small short-circuits among the stator winding.

The input signal, p(n), to the FLSFD is obtained as a difference between two consecutive SVAF samples. The value of each p(n) sample is evaluated against the threshold parameter or fault determining parameter d. If the difference between two consecutive SVAF samples is found to be greater than d, then the last healthy SVAF sample is remembered and subsequent samples, p(n), are sought as a difference between the current and last healthy sample.

The input signal to the FLSFD, p(n), is given by the following equation (15):

$$p(n)=abs[\text{SVAF}(n+1)-\text{SVAF}(n)] \quad (15)$$

For every p(n) smaller than threshold d, current SVAF sample is remembered as healthy (16):

$$\text{For every } (p(n)<d),\ \text{SVAF}_{healthy}=\text{SVAF}(n) \quad (16)$$

If p(n) is greater than threshold d, it takes the new value equal to the difference between the healthy and current SVAF (17):

$$(p(n)>d)\rightarrow p(n)=abs\lfloor SVAF_{healthy}-\text{SVAF}(n+1)\rfloor \quad (17)$$

Signals obtained from the FLSFD are brought down to zero for normal, initial degrees of unbalance present in the system. However, subsequent sudden worsening of the working condition results in the increase of the unbalance followed by this signal as a rise in its amplitude. A gradual, slow increase in the unbalance will not cause a rise in the amplitude of this signal reducing the possibility of unbalanced voltage or load change being mistaken for a stator winding fault or short.

The FLSFD technique is just one technique of using fuzzy logic. Other variations of the FLSFD are apparent and may be used in accordance with the invention.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts or events of the various methods of the invention.

In addition, while a particular feature of the invention may have been disclosed with respect to only one of several implementations, such feature may be combined with one or more other features of the other implementations as may be desired and advantageous for any given or particular application. As used in this application, the term "component" is intended to refer to a computer-related entity, either hardware, a combination of hardware and software, software, or software in execution. For example, a component may be, but is not limited to, a process running on a processor, a processor, an object, an executable, a thread of execution, a program, and a computer. Furthermore, to the extent that the terms "includes", "including", "has", "having", and variants thereof are used in either the detailed description or the claims, these terms are intended to be inclusive in a manner similar to the term "comprising."

What is claimed is:

1. A method of detecting faults in a motor, comprising:

obtaining a current signal associated with the motor;

calculating a space vector from the current signal;

determining a space vector angular fluctuation from the space vector; and analyzing the space vector angular fluctuation in order to detect at least one fault associated with the motor.

2. The method of claim 1, wherein obtaining the current signal comprises sampling first, second, and third phase current signals associated with the motor.

3. The method of claim 2, wherein the first, second, and third current signals are sampled at a frequency greater than six times the frequency of power applied to the motor.

4. The method of claim 2, wherein determining the space vector angular fluctuation comprises:

performing a comparison of the space vector with a reference space vector, wherein the reference space vector is a function of a constant frequency and amplitude; and computing angular fluctuations in the space vector according to the comparison.

5. The method of claim 4, wherein computing angular fluctuations in the space vector comprises subtracting two subsequent phase angles corresponding to two subsequent positions of the space vector.

6. The method of claim 4, wherein analyzing the space vector angular fluctuation in order to detect at least one fault associated with the motor comprises performing frequency spectrum analysis of the space vector angular fluctuation.

7. The method of claim 6, wherein performing frequency spectrum analysis of the space vector angular fluctuation comprises:

computing a frequency spectrum of the space vector angular fluctuation; and analyzing the amplitude of a first spectral component of the frequency spectrum at a first frequency.

8. The method of claim 6, wherein performing frequency spectrum analysis of the space vector angular fluctuation comprises:

computing one frequency component of the space vector angular fluctuation; and analyzing the amplitude of a first spectral component of the frequency component at a first frequency.

9. The method of claim 7, wherein analyzing the amplitude of a first spectral component of the frequency spectrum at a first frequency comprises analyzing fluctuations in amplitude of the first spectral component in order to detect at least one fault associated with the motor.

10. The method of claim 7, wherein the first frequency is approximately twice the frequency of power applied to the motor.

11. The method of claim 10, wherein analyzing the amplitude of the first spectral component comprises using a Goertzel algorithm to extract the first spectral component from the space vector angular fluctuation.

12. The method of claim 11, wherein analyzing the amplitude of the first spectral component comprises using a Goertzel algorithm to extract the amplitude of the first spectral component from the space vector angular fluctuation during each cycle of the power applied to the motor.

13. The method of claim 10, wherein the at least one fault comprises at least one of a stator fault, a rotor fault and an imbalance in the power applied to the motor.

14. The method of claim 13, further comprising distinguishing motor faults from unbalanced power conditions.

15. The method of claim 14, wherein distinguishing motor faults from unbalanced power conditions comprises using a fuzzy logic system.

16. A method of detecting faults in a motor, comprising:

obtaining a voltage signal associated with the motor;

calculating a space vector from the voltage signal;

determining a space vector angular fluctuation from the space vector; and analyzing the space vector angular fluctuation in order to detect at least one fault associated with the motor.

17. The method of claim 16, wherein obtaining the voltage signal comprises sampling first, second and third voltage signals associated with the motor.

18. A method of detecting faults in a motor, comprising:

determining a threshold parameter;

obtaining a first and second current samples;

calculating a difference between the first and the second current samples;

on the difference being less than the threshold parameter, remembering the difference as a healthy sample; and on the difference being greater than the threshold parameter, modifying the threshold parameter to be equal to the difference.

19. The method of claim 18, wherein determining a threshold parameter comprises determining a threshold parameter large enough to tolerate normal fluctuations and small enough to detect short circuits in stator windings.

20. A system for detecting faults in a motor, comprising:

means for obtaining a current signal associated with the motor;

means for calculating a space vector from the current signal;

means for determining a space vector angular fluctuation from the space vector; and means for analyzing the space vector angular fluctuation in order to detect at least one fault associated with the motor.

21. A system for detecting faults in a motor, comprising a diagnostic component operative to obtain a space vector angular fluctuation from a current signal relating to operation of the motor, and to analyze the space vector angular fluctuation in order to detect at least one fault in the motor.

22. The system of claim 21, comprising a sensor operatively associated with the motor to obtain the current signal relating to the operation of the motor, and adapted to provide the current signal to the diagnostic component.

23. The system of claim 22, further comprising:

a controller operatively associated with the motor and adapted to operate the motor in a controlled fashion; and a motor drive adapted to provide electrical power to the motor according to a control signal from the controller.

24. The system of claim 20, wherein the diagnostic component is adapted to obtain a current signal associated with the motor, to calculate a space vector from the current signal, to determine a space vector angular fluctuation from the space vector, and to analyze the space vector angular fluctuation in order to detect at least one fault associated with the motor.

25. The system of claim 24, wherein the diagnostic component is adapted to sample first, second, and third phase current signals associated with the motor in order to obtain the current signal, and to calculate the space vector from the current signal.

26. The system of claim 25, wherein the diagnostic component is adapted to perform a comparison of the space vector with a reference space vector, wherein the reference space vector is a function of a constant frequency and amplitude, and to compute angular fluctuations in the space vector according to the comparison, in order to determine the space vector angular fluctuation.

27. The system of claim 25, wherein the diagnostic component is adapted to perform a comparison of the space vector with a reference space vector, wherein the reference space vector is a function of a voltage space vector.

28. The system of claim 26, wherein the diagnostic component is adapted to compute an arctangent function in order to compute angular fluctuations in the space vector.

29. The system of claim 26, wherein the diagnostic component is adapted to perform frequency spectrum analysis of the space vector angular fluctuation in order to analyze the space vector angular fluctuation in order to detect at least one fault associated with the motor.

30. The system of claim 29, wherein the diagnostic component is adapted to compute a frequency spectrum of the space vector angular fluctuation, and to analyze the amplitude of a first spectral component of the frequency spectrum at a first frequency in order to perform frequency spectrum analysis of the space vector angular fluctuation.

31. The system of claim 30, wherein the diagnostic component is adapted to analyze fluctuations in amplitude of the first spectral component in order to detect at least one fault associated with the motor.

32. The system of claim 30, wherein the first frequency is approximately twice the frequency of power applied to the motor.

33. The system of claim 32, wherein the diagnostic component is adapted to use a Goertzel algorithm to extract the amplitude of the first spectral component from the space vector angular fluctuation in order to analyze the-amplitude of the first spectral component.

34. The system of claim 32, wherein the at least one fault comprises at least one of a stator fault, a rotor fault, and an imbalance in the power applied to the motor.

* * * * *